(12) United States Patent
Marrocco et al.

(10) Patent No.: US 8,124,443 B2
(45) Date of Patent: Feb. 28, 2012

(54) ORGANIC DIODES AND MATERIALS

(76) Inventors: Matthew L. Marrocco, Oviedo, FL (US); Farshad J. Motamedi, Claremont, CA (US)

(*) Notice: Subject to any disclaimer, the term of this patent is extended or adjusted under 35 U.S.C. 154(b) by 1 day.

(21) Appl. No.: 12/687,986

(22) Filed: Jan. 15, 2010

(65) Prior Publication Data

US 2010/0112751 A1     May 6, 2010

Related U.S. Application Data

(62) Division of application No. 10/953,598, filed on Sep. 28, 2004, now Pat. No. 7,655,961.

(51) Int. Cl.
*H01L 51/40* (2006.01)

(52) U.S. Cl. ............ 438/99; 438/91; 438/135; 438/144; 438/149; 438/478; 257/40; 257/E51.001

(58) Field of Classification Search ............ 438/91, 438/99, 135, 144, 149, 478
See application file for complete search history.

(56) References Cited

U.S. PATENT DOCUMENTS

| | | | | |
|---|---|---|---|---|
| 5,264,048 A | * | 11/1993 | Yoshikawa et al. | ............ 136/263 |
| 5,637,421 A | | 6/1997 | Poehler et al. | |
| 6,037,718 A | | 3/2000 | Nagami | |
| 6,096,453 A | * | 8/2000 | Grunwald | .................... 429/212 |
| 6,340,789 B1 | | 1/2002 | Petritsch et al. | |
| 6,433,355 B1 | | 8/2002 | Riess et al. | |
| 2002/0149010 A1 | | 10/2002 | Wakimoto et al. | |
| 2003/0022020 A1 | * | 1/2003 | Epstein et al. | ............... 428/690 |

FOREIGN PATENT DOCUMENTS

| | | |
|---|---|---|
| JP | 2001259564 | 9/2001 |
| JP | 2003264303 | 3/2002 |
| JP | 2002289355 | 10/2002 |
| JP | 2002299049 | 10/2002 |
| JP | 2005121770 | 5/2005 |

OTHER PUBLICATIONS

Arias et al., "Photovoltaic Performance and Morphology of Polyfluorene Blends: A Combined Microscopic and Photovoltaic Investigation", Macromolecules 2001, vol. 34, No. 17, pp. 6005-6013.
Dimagno et al., "Facile Elaboration of Porphyrins Via Metal-Mediated Cross-Coupling", Journal of Organic Chemistry, 1993, vol. 58, No. 22, pp. 5983-5993.
Dimitrakopoulos et al., "Organic Thin-Film Transistors: A Review of Recent Advances", IBM J. Res. & Dev., 2001, vol. 45, No. 1, pp. 11-27.
Gregg et al., "Comparing Organic to Inorganic Photovoltaic Cells: Theory, Experiment, and Simulation", Journal of Applied Physics, Mar. 15, 2003, vol. 93, No. 6, pp. 3605-3614.

(Continued)

*Primary Examiner* — Wai Sing Louie
(74) *Attorney, Agent, or Firm* — Kauth, Pomeroy, Peck & Bailey LLP

(57) ABSTRACT

Diodes having p-type and n-type regions in contact, having at least one of either the p-type region or n-type region including a conjugated organic material doped with an immobile dopant, conjugated organic materials for incorporation into such diodes, and methods of manufacturing such diodes and materials are provided.

27 Claims, 6 Drawing Sheets

OTHER PUBLICATIONS

Gregg et al., "Doping of Molecular Semiconductors", J. Am. Chem. Soc., 2001, vol. 123, No. 32, pp. 7959-7960.

Hara et al., "Photocatalytic Oxidation of Water by Silica-Supported Tris(4,4'-dialkyl-2-2'-bipyridyl)ruthenium Polymeric Sensitizers and Colloidal Iridium Oxide", Chem. Mater., 2001, vol. 13, No. 12, pp. 4668-4675.

Little et al., "The Synthesis of Some Substituted Tetraarylporphyrins", J. Heterocyclic Chemistry, Apr. 1975, vol. 12, No. 2, pp. 343-349.

International Search Report for International Application PCT/US2004/032399 filed Sep. 29, 2004, 8 pgs.

\* cited by examiner

ORGANIC DIODES AND MATERIALS

CROSS-REFERENCE TO RELATED APPLICATION

This application is a divisional application of U.S. application Ser. No. 10/953,598 which application claims priority to U.S. Provisional Application No. 60/508,781, filed Oct. 2, 2003, the disclosure of which is incorporated herein by reference.

FIELD OF THE INVENTION

The present invention is directed to improved diodes, and more particularly to diodes incorporating doped organic materials.

BACKGROUND OF THE INVENTION

Semiconductors and semiconductor devices are ubiquitous in the modern world. Diodes, transistors, integrated circuits, light emitting diodes (LEDs), solar cells, semiconductor lasers, and the like are used in radios, televisions, computers, automobiles, home appliances, industrial equipment, and essentially anywhere information is stored, transmitted or controlled electrically. At present, semiconductor devices are nearly exclusively inorganic semiconductors, and almost exclusively silicon or gallium arsenide based. But silicon and other inorganic semiconductors are mechanically brittle, costly to make, purify, and process, and must be processed at high temperatures.

It would be desirable to have semiconductors and semiconducting devices that were flexible, for example, so that electrical circuits could be flexed during use and/or bent to conform to curved surfaces. It would also be desirable to have semiconductors and semiconducting devices that were easier and less costly to purify and process. And it would be desirable to have semiconductors and semiconducting devices that could be processed and fabricated at low temperatures, in particular at temperatures below the glass transition temperature of common plastics such as polyesters and polyamides, so that plastics such as these could be used as substrates on which to build semiconducting devices and circuits.

While semiconductor devices using organic instead of inorganic materials have been fabricated before, these devices consisted of only undoped organic compounds, or organic compounds doped with small, relatively mobile ions such as bromide anions or sodium cations. Doping with small, mobile ions is undesirable because the positive (donor) and negative (acceptor) dopants can meet and neutralize one another. On the other hand making diodes or p-n junctions with undoped semiconductors seriously limits the current that may be passed through such a device. Unlike conventional p-n junctions where a p-type semiconductor makes contact with an n-type semiconductor, junctions of undoped semiconductors do not form depletion layers or built in potentials—the basis for many p-n junction properties. This built in potential is essential for the operation of conventional semiconductor junction solar cells, for example.

There is a growing literature on organic transistors. These are all made with pure, undoped polymers, oligomers, or small molecules (see for example, C. D. Dimitrakopoulos and D. J. Mascaro, "Organic thin-film transistors: A review of recent advances," IBM J. of Res. & Dev. 2001, 45, 11-27). Essentially, all reported organic transistors are of the field effect type, in which electrical potential on a gate electrode alters the number and path of charge carriers in a thin undoped organic layer, and thus the current flow between a source electrode and a drain electrode on opposite ends of the thin organic layer. Organic field effect transistors do not have a p-n junction and performance is improved if adventitious dopants are removed from the single organic layer.

Accordingly, it would be desirable to find organic materials and methods for fabrication of bipolar transistors.

There have been numerous reports of organic solar cells, which are often referred to as organic p-n junctions. While these solar cells produce photovoltages and photocurrents they are invariably fabricated with undoped polymers or undoped small molecules. Since they are undoped they are not true p-n junctions, and therefore not true analogs of silicon or inorganic p-n junctions. A true organic p-n junction would consist of an organic material doped with an acceptor (p-type) in contact with a piece of the same organic material doped with a donor (n-type), forming a p-n homojunction. Likewise, a true organic heterojunction would consist of an organic material doped with an acceptor (p-type) in contact with a piece of a different organic material doped with a donor (n-type). Contact between two undoped polymers is more correctly referred to as a polymer bilayer, and not a p-n junction. Polymer bilayers do not develop a space charge region or a built in potential, and have relatively high resistivity.

In a recent study on Organic Photovoltaic (OPV) cells Gregg and Hanna remarked, "To our knowledge, no homojunction OPV cells have been reported, probably due to the difficulty of doping organic semiconductors." (B. A. Gregg and M. C. Hanna, J. Appl. Phys., 2003, 93, 3605-3614.) One of the difficulties referred to by Gregg et al. is the higher mobility of dopants in organic materials relative to inorganics. Another difficulty is the lack of organic doping agents that can reduce (n-type) or oxidize (p-type) an organic material and leave behind only a cation dopant (n-type) or an anion dopant (p-type) and no other byproducts.

It would be highly desirable to be able to prepare both n-doped and p-doped organic semiconductors, where the dopants are not mobile and do not diffuse during use or over the lifetime of the device. It would be further desirable to prepare true p-n junctions of organic materials, such that a built in potential is developed, and where dopants do not diffuse and neutralize each other. It would also be desirable to have organic diodes, transistors, LEDs, semiconductor lasers, photocells and solar cells based on such true organic p-n junctions.

SUMMARY OF THE INVENTION

The current invention is directed to diodes incorporating novel doped conjugated organic materials in p-n junctions.

In one embodiment, the present invention is directed to a diode having a p-type region and an n-type region in contact, where at least one of either the p-type region or n-type region is a conjugated organic material doped with an immobile dopant. In such an embodiment, the conjugated organic material may be a conjugated small molecule, oligomer, or polymer.

In another embodiment, the diode may have both p-type region and n-type regions comprised of a conjugated organic material including suitable immobile dopants.

In still another embodiment, the present invention is directed to a composition comprising a first conjugated organic material, an immobile donor dopant, a second conjugated organic material which may be the same or different from the first conjugated material, and an immobile acceptor dopant, where the first and second conjugated organic material have at least one phase boundary. In such an embodiment, preferably the donor and acceptor dopants are confined to separate phases, preferably with at least 80% of the acceptor dopant in the first phase and at least 80% of the donor dopant in the second phase, more preferably with at least 90% of each dopant in its respective phase, even more preferably with at least 99% of each dopant in its respective phase.

In yet another embodiment, the present invention is directed to transistors or other semiconductor devices comprising two or more p-n junctions, and three or more semiconducting regions, where at least two of the semiconducting regions are comprised of conjugated organic materials. In such embodiments, said transistors and semiconductor devices may be connected to form circuitry of arbitrary complexity.

In still yet another embodiment, the present invention is directed to organic solar cells or photovoltaic cells comprised of at least one conjugated organic material doped with an immobile dopant, and a second semiconducting region comprised of any (organic or inorganic) doped semiconductor. In such an embodiment, the organic solar cell may have both p-type and n-type regions comprised of conjugated organic materials doped with immobile dopants.

In still yet another embodiment, the present invention is directed to photodiodes for sensing light or radiation, comprised of a conjugated organic material doped with an immobile dopant.

BRIEF DESCRIPTION OF THE DRAWINGS

These and other features, aspects, and advantages of the present invention will be more fully understood when considered with respect to the following detailed description, appended claims, and accompanying drawings, wherein:

DETAILED DESCRIPTION OF THE INVENTION

Figure 1:
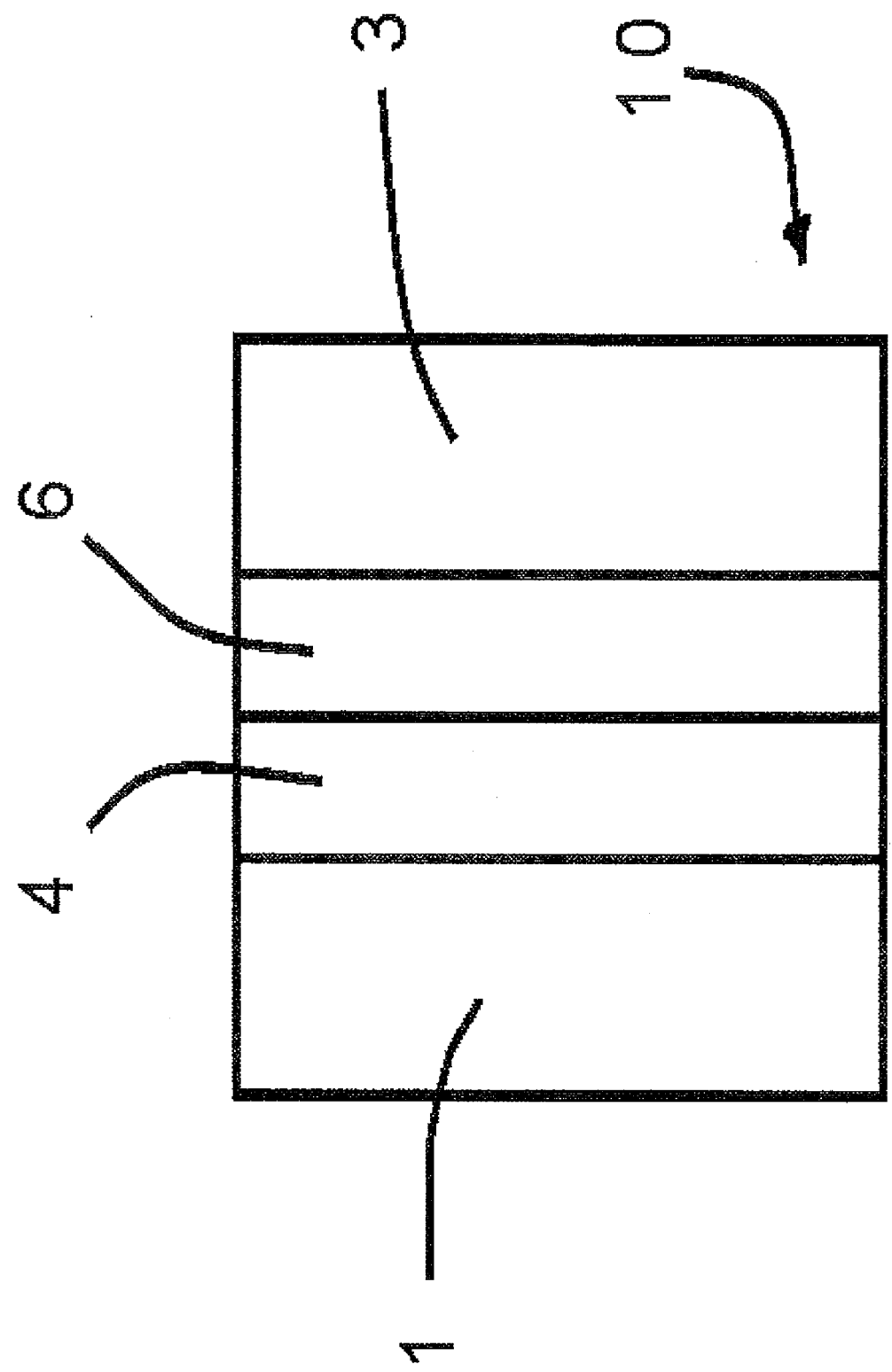
FIG. 1 is a schematic view of one embodiment of an organic diode provided in accordance with practice of the present invention.

The current invention is directed to diodes incorporating novel doped conjugated organic materials in p-n junctions.

While there has been a significant effort, especially over the last 20 years, to develop organic electronics, including organic p-n junctions, no true stable organic p-n junction has yet been demonstrated. The present invention demonstrates that stable organic p-n junctions can be prepared and used in diodes and other devices by designing doping agents and fabrication methods that take into account factors that control mobility of the dopant in the organic matrix and solubilities of doping agent, organic matrix, and doped organic matrix in processing solvents.

In one embodiment of the current invention the desired composition comprises an organic matrix that is doped with both an acceptor and a donor such that the acceptor is predominantly in one region of the matrix and the donor is predominantly in a second, different region of the matrix, and that the acceptor and donor regions meet at a phase boundary.

In another embodiment the desired composition comprises a phase separated blend of one organic matrix doped with at least one acceptor dopant, and another organic matrix doped with at least one donor dopant, where the two phases may exist in various geometries, including, but not limited to, two contacting planar sheets, two sheets with a corrugated phase boundary, two sheets with an indistinct phase boundary having a finite thickness, interpenetrating phases, gradient phases, two single phase regions separated by a region of mixed phases (see FIG. 6), and the like.

DEFINITIONS

These and other features, aspects, and advantages of the present invention will be more fully understood when considered with respect to the following general definitions.

An immobile dopant means that the dopant has a mobility of essentially zero in the matrix at the maximum use temperature. While mobility or diffusivity can never be reduced to zero, practically it must be made low enough so that the dopant cannot diffuse or migrate across the thickness of the organic layer over the lifetime of the device. The mobility will depend on such factors as the shape and size of the dopant, on the viscosity of the matrix (which is a function of temperature), the structure of the matrix (linear, branched, crosslinked), and specific interactions between the dopant and matrix (e.g., hydrogen bonding, van der Weals forces, electrical forces). For inorganic semiconductors like silicon, the dopants are immobile at room temperature, but mobile at much higher temperatures. Mobility at high temperatures is crucial to silicon semiconductor device fabrication and is well understood in the art. Organic semiconductor lattices are not as rigid as inorganic semiconductor lattices and dopants will become mobile and diffuse through the lattice at much lower temperatures. It is well known in the art that diffusion and migration of molecules and ions in an organic substance (small molecule, oligomer, or polymer) is much slower below the glass transition temperature ($T_g$) of the substance. The compositions of the present invention will preferably have $T_g$ above room temperature, more preferably, $T_g$ greater than 50° C., even more preferably $T_g$ greater than 60° C., yet more preferably $T_g$ greater than 70° C., even more preferably $T_g$ greater than 80° C., even more preferably $T_g$ greater than 90° C., and most preferably $T_g$ greater than 100° C.

The mobility or diffusivity of ions and molecules dissolved in a matrix undergo an abrupt change at the glass transition temperature of the matrix. To prevent dopants from diffusing or migrating the matrix may be chosen such that its $T_g$ is higher, preferably 10° C., more preferably 25° C., even more preferably 50° C., and most preferably 75° C., than the highest temperature to which it will be exposed or used. Alternatively, the dopant may be chemically attached to the matrix. If a dopant is chemically attached to a polymer the polymer is said to be self-doped. In a self-doped polymer above the $T_g$ the dopant can move locally, but long range motion is limited by the motion of the entire polymer chain. For a self-doped polymer below $T_g$ long range motion is essentially zero.

It will also be understood by one skilled in the art that a dopant can affect the $T_g$ of the doped polymer. A dopant may lower the $T_g$ (plasticizer) or raise the $T_g$ (antiplasticizer). The dopant must be compatible (i.e., remain homogeneously distributed in) the organic matrix and must not lower the $T_g$ below the use temperature of the device.

For the purposes of the present invention a dopant is immobile if:
1) it is chemically attached or is part of a polymer chain of weight average molecular weight Mw greater than 1,000 daltons, preferably greater than about 5,000 daltons, and more preferably greater than about 10,000, where the polymer chain may be the semiconducting polymer itself (self-doped) or a separate polymer of any type, semiconducting or not;
2) it has a molecular weight (MW) greater than 1,000, preferably greater than about 5,000 daltons, and more preferably greater than about 10,000 daltons;
3) it has a MW greater than 100, preferably greater than 250, more preferably greater than 500 daltons, and the polymer matrix, including the dopant, has a $T_g$ greater than 40° C.;
4) it has a MW greater than 1,000, preferably greater than 2,000, and the polymer matrix, including the dopant, has a $T_g$ greater than 25° C.;
5) it has a MW greater than 100, preferably greater than 250, more preferably greater than 500 daltons, and the polymer matrix is crosslinked; or
6) it has a diffusion coefficient of less than $1\times10^{-6}$ cm$^2$ s$^{-1}$ when measured in any solvent at 25° C.

It will be recognized by one skilled in the art that diffusion of the dopant may limit the lifetime of the device. In this case, reducing the diffusion coefficient by a) increasing the dopant MW, b) increasing the polymer $T_g$, c) crosslinking the polymer or increasing the crosslink density, or d) chemically attaching the dopant to a polymer, may increase the lifetime of the device, and that these techniques may be employed even if the diffusion coefficient cannot be measured directly. The magnitude of the diffusion coefficient required will depend on the particular application. It will also be recognized by one skilled in the art that the diffusion coefficient in the polymer matrix is only roughly proportional to the diffusion coefficient in solution, and that this limit is only a rough guide.

The diffusion coefficient of the dopant may be measured by any technique, for example, NMR methods are well known for measuring diffusion coefficients in solutions. Since the charge will have a relatively small effect on the diffusion coefficient, a dopant will be considered to be immobile if the diffusion coefficient of either the zwitterionic doping agent or the charged dopant is less than $3\times10^{-6}$ cm$^2$ s$^{-1}$, preferably less than $2\times10^{-6}$ cm$^2$ s$^{-1}$, more preferably less than $1\times10^{-6}$ cm$^2$ s$^{-1}$ when measured as a solution.

The roughness factor of a surface is the ratio of the true, actual surface area with the geometric surface area. The phase boundary between two layers may be indistinct or have a finite thickness. The thickness of an indistinct phase boundary is preferably between 1 and 1000 nm, more preferably between 1 and 100 nm, yet more preferably between 2 and 50 nm, even more preferably between 5 and 25 nm. The phase boundary may be larger than 1000 nm or smaller than 1 nm. A phase boundary is considered distinct herein if it is less than about 1 nm. The phase boundary may or may not be simply connected. That is it may not be a simple plane, but rather a series of spheres or rods, of varying size, and interconnected in various ways. For example, the phase boundary may be hexagonally packed rods. The structure of phase boundaries between polymers is well known in the art. The present invention is not limited by the particular structure of the phase boundary. It is well known in the art that the structure of the phase boundary, or the morphology, is dependent on the preparation conditions. For example, the same starting composition may give very different morphology when spin coated if the atmosphere is saturated or not saturated with solvent. (see A. C. Arias et al., *Macromol*, 2001, 34, 6005-6013).

The term dopant is used in two senses in the semiconductor literature. In the first sense a dopant is an ion or atom that is present in a semiconductor lattice having a valence higher or lower than the semiconductor and thereby donating or accepting electrons from the conduction or valence bands respectively. An example is boron doped into silicon. The boron dopant atom replaces a silicon atom in the lattice, but because boron has a lower valance (3) than silicon (4), it has fewer electrons to give up to the valence band and therefor generates a hole in the valence band. The boron atom develops a negative charge which balances the charge of the hole. The boron dopant is said to be an acceptor dopant, accepting an electron out of the valence band. Similarly, phosphorous (valence 5), when doped into silicon donates an electron to the conduction band, and balances the charge by developing a positive charge. The mechanism of doping is of secondary importance to the properties of the doped semiconductor. In the second sense a dopant is a chemical that is used to dope a semiconductor. For example, silicon may be doped with phosphorous by treating a silicon crystal with phosphine (PH$_3$) gas at elevated temperature. In another example, a polymer such as polythiophene is doped with bromine (Br$_2$) to give a partially oxidized polythiophene containing bromide ions. One can speak of the dopant being bromide ion (first sense) or Br$_2$ (second sense). The chemical literature tends to use dopant in the second sense. For the purposes of the present invention, the term dopant will be used in the first sense, that is to mean the ionic species present in the semiconductor after the doping process. The term doping agent is used here to refer to the chemical used to dope a semiconductor.

Polymer substituents include but are not limited to C1 to C24 alkyl, C1 to C24 aryl, C1 to C24 alkoxy, thioether, perfluoroalkyl, perfluoroaryl, polyfluoroalkoxy, amide, ester, cyano, halide, sulfone, sulfoxide.

An electrode, for the purpose of the present invention, is any electrically conducting substance, typically a metal or highly doped semiconductor. Electrodes may be opaque, transparent, or translucent. If transparent the transparency may range from 1 to 100% light transmission anywhere in the visible spectrum, preferably at least 10% transmissive over the range 400 to 600 nm, more preferably at least 25% transmissive over the range 400 to 600 nm, and most preferably at least 50% transmissive over the same range.

Conjugated molecules are defined here to mean molecules having at least two, preferably at least three, and more preferably at least four, even more preferably at least five and most preferably, at least six conjugated electron pairs. Non-limiting examples of conjugated molecules are butadiene, benzene, naphthalene, biphenyl, terphenyl, stilbene, and the like.

Conjugated polymers or oligomers are defined here to mean polymers or oligomers having conjugated repeat units with substantial conjugation between repeat units. Preferably at least 10% of neighboring repeat units will be conjugated, more preferably at least 25% of neighboring repeat units will be conjugated, even more preferably at least 50% of neighboring repeat units will be conjugated. Up to 100% of neighboring repeat units may be conjugated. Non-limiting examples of conjugated oligomers are oliothiophenes, oligophenylenes, and oligophenylenevinylene. Non-limiting examples of conjugated oligothiophenes are hexathiophene and tetrathiophene. Non-limiting examples of conjugated polymers are polyacetylene, polyaniline, polyarylamine, polycarbazole, polydiacetylene, polyfluorene, polyphenylene, polyphenyleneacetylene, polyphenylenevinylene, polypyrrole, polyquinazoline, polyquinoline, polyquinoxaline, polydiphenylsilane, polythiophene, and copolymers of these, and substituted forms of these.

For the purposes of the present invention an organic material is any substance or mixture of substances having greater than 1%, more preferably greater than 10%, and most preferably greater than 15% by weight carbon content. The term polymer includes polymers of any type, non-limiting examples of which are linear, branched, hyperbranched, dendritic, cyclic, comb, brush, addition, condensation, copolymers, block copolymer, random copolymers, thermoplastic and thermosetting.

For the purposes of the present invention fluoroalkyl encompasses monofluoralkyl, difluoroalkyl, polyfluoroalkyl and perfluoroalkyl. Fluoroaryl encompasses monofluoraryl, difluoroaryl, polyfluoroaryl and perfluoroaryl.

A semiconducting layer or semiconducting region may be comprised of any semiconducting material, organic or inorganic, or a mixture of organic and inorganic, and may be intrinsic (undoped) or extrinsic (doped). Non-limiting examples of inorganic semiconducting layers or regions are layers or regions of silicon, germanium, silicon-germanium alloys and compounds, gallium arsenide, gallium phosphide, gallium nitride, cadmium sulfide, cadmium selenide, and the like, either doped or undoped. Non-limiting examples of organic semiconductor layers or regions are layers or regions of polythiophene, polyphenylene, pentacene, hexathiophene, and the like, either doped or undoped.

Embodiments

Turning to FIG. 1 there is shown one embodiment of an organic diode 10 provided in accordance with practice of the present invention. The organic diode 10 includes a first electrode 1 which is in contact with a first region 4 comprising a conjugated organic material doped with an immobile dopant, a second region 6 comprising a doped semiconductor in contact with first region 4 and thereby forming a p-n junction at the interface of regions 4 and 6, and a second electrode 3 in contact with the second region 6.

The semiconductor of second region 6 may be organic or inorganic. If the semiconductor of the second region 6 is organic it comprises a conjugated material and an immobile dopant of opposite type of the dopant in the first region 4, and may be either the same or different from the conjugated organic material of the first region 4.

In one embodiment of the present invention diode 10 functions as a photodiode and one or both of electrodes 1 and 3 are transparent.

In another embodiment of the present invention diode 10 functions as a photovoltaic cell and one or both of electrodes 1 and 3 are transparent.

Figure 2:
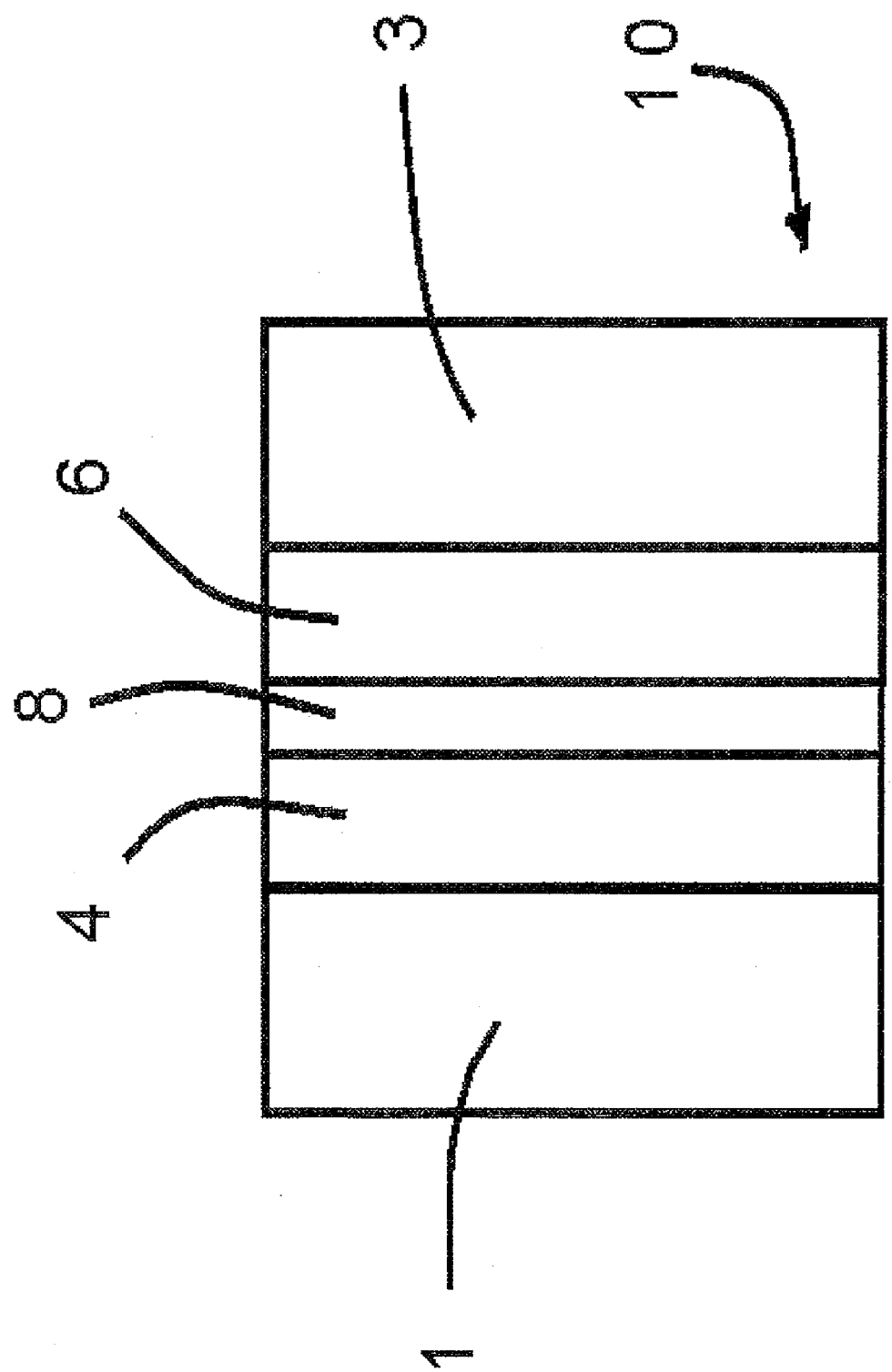
FIG. 2 is a schematic view of another embodiment of an organic diode provided in accordance with practice of the present invention, where the phase boundary between the p-type and n-type regions has a finite thickness.

Turning to FIG. 2 there is shown one embodiment of an organic diode 10 provided in accordance with practice of the present invention. The organic diode 10 includes a first electrode 1 which is in contact with a first region 4 comprising a conjugated organic material doped with an immobile dopant, a second region 6 comprising a conjugated material and an immobile dopant of opposite type of the dopant in the first region 4, and may be either the same or different from the conjugated organic material of the first region 4, where the contact between regions 4 and 6 has a finite thickness forming a mixed region 8. A second electrode 3 is in contact with region 6.

Figure 3:
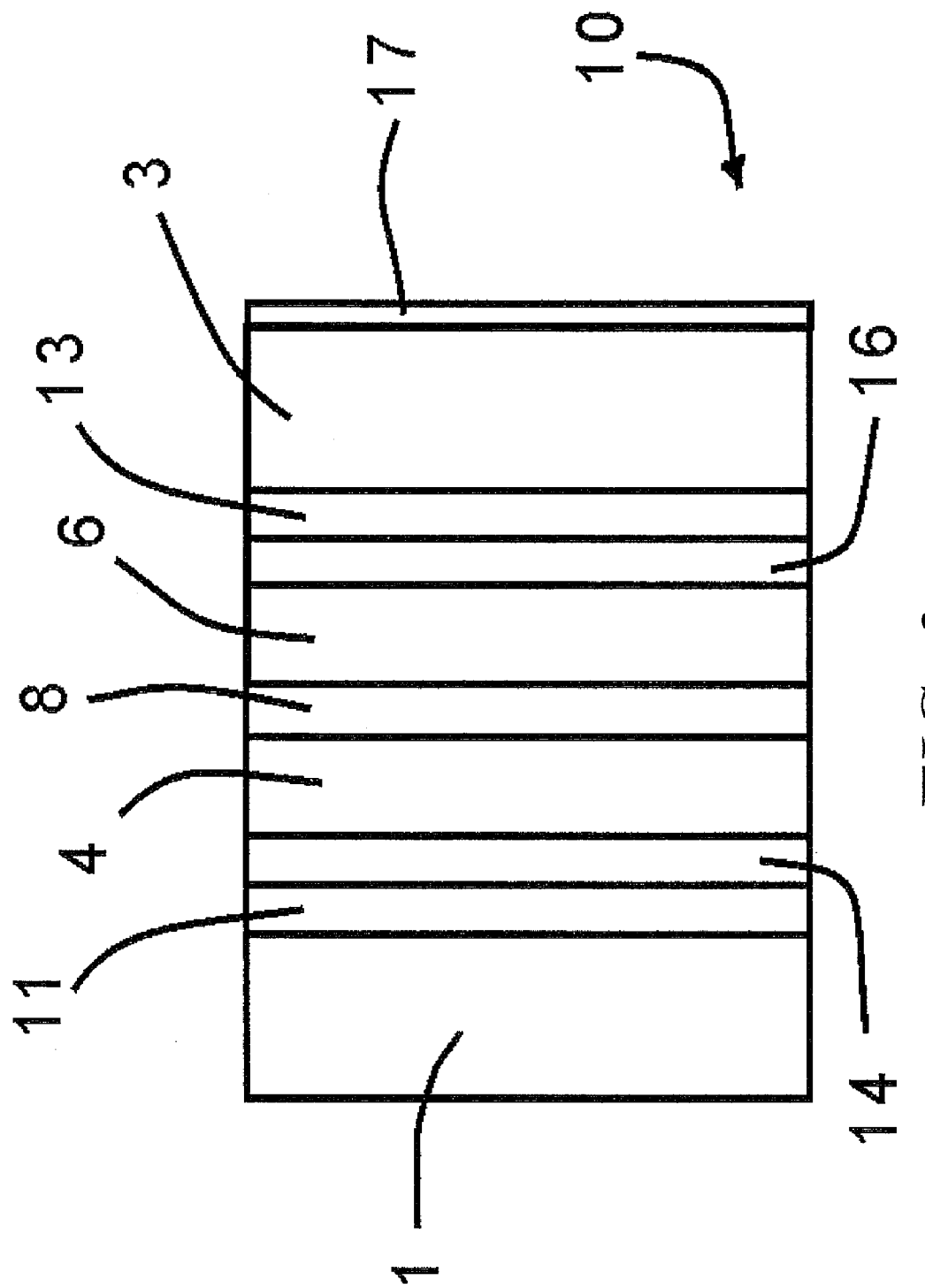
FIG. 3 is a schematic view of another embodiment of an organic diode provided in accordance with practice of the present invention, where additional layers are present and may include an electron transport layer, hole transport layer, p+ layer, n− layer, electron blocking layer, hole blocking layer, and or buffer layer.

Turning to FIG. 3 there is shown one embodiment of an organic diode 10 provided in accordance with practice of the present invention. The organic diode 10 includes a first electrode 1 which is coated with optional layer 11 comprising either an electron transport, hole transport, n+ or p+ materials, and optional layer 14 comprising an electron or hole blocking material, in contact with a first region 4 comprising a conjugated organic material doped with an immobile dopant, a second region 6 comprising a conjugated material and an immobile dopant of opposite type of the dopant in the first region 4, and may be either the same or different from the conjugated organic material of the first region 4, where the contact between regions 4 and 6 has a finite thickness forming a mixed region 8. A second electrode 3, optionally coated with either an electron transport, hole transport, n+ or p+ layer 13, and optional layer 16 comprising an electron or hole blocking material, is in contact with region 6.

FIGS. 1-3, although schematically depicted as a plane, the contact region between regions 4 and 6, including a thick region such as region 8 in FIG. 2, may have any topology, including rough, wavy, corrugated, continuous, discontinuous, flat, or smooth.

Figure 4:
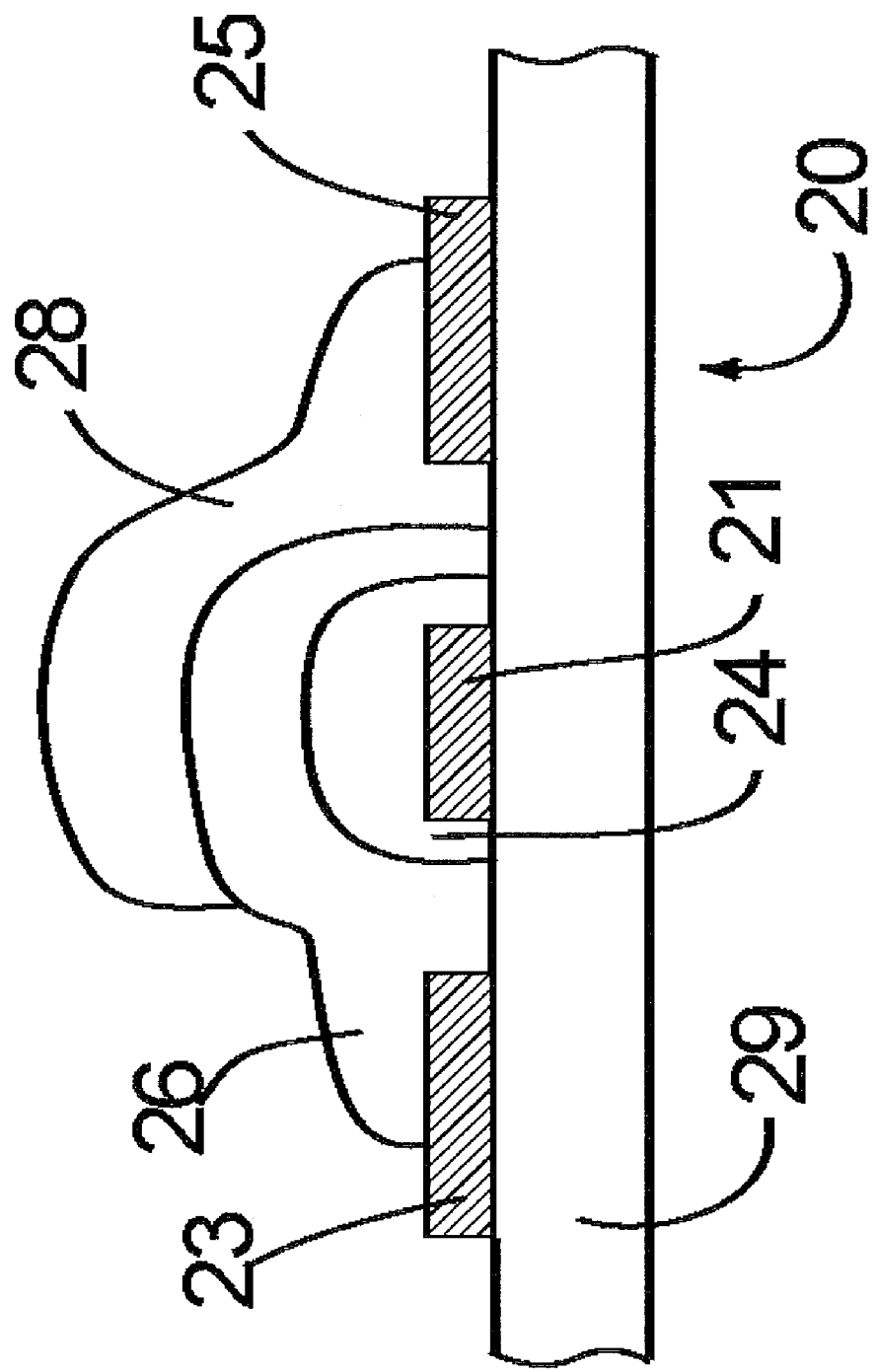
FIG. 4 is a cross sectional view of one embodiment of an organic transistor provided in accordance with the practice of the present invention.

Turning to FIG. 4 there is shown one embodiment of an organic transistor 20 provided in accordance with practice of the present invention. Electrodes 21, 23, and 25 are provided on insulating substrate 29 to contact organic material layers 24, 26, and 28 respectively. Two p-n junctions are formed between regions 24 and 26, and between regions 26 and 28. If region 26 is n-type then regions 24 and 28 are p-type. If region 26 is p-type then regions 24 and 28 are n-type. Additional layers, not shown, may be provided for improved charge carrier injection and collection at the electrodes, for controlling electrode smoothness, or for generally enhancing device performance. The phase boundaries between regions 24 and 26, and between regions 26 and 28 may be distinct, non-distinct, have finite thickness, be smooth or rough, continuous or discontinuous as required by the application.

Figure 5:
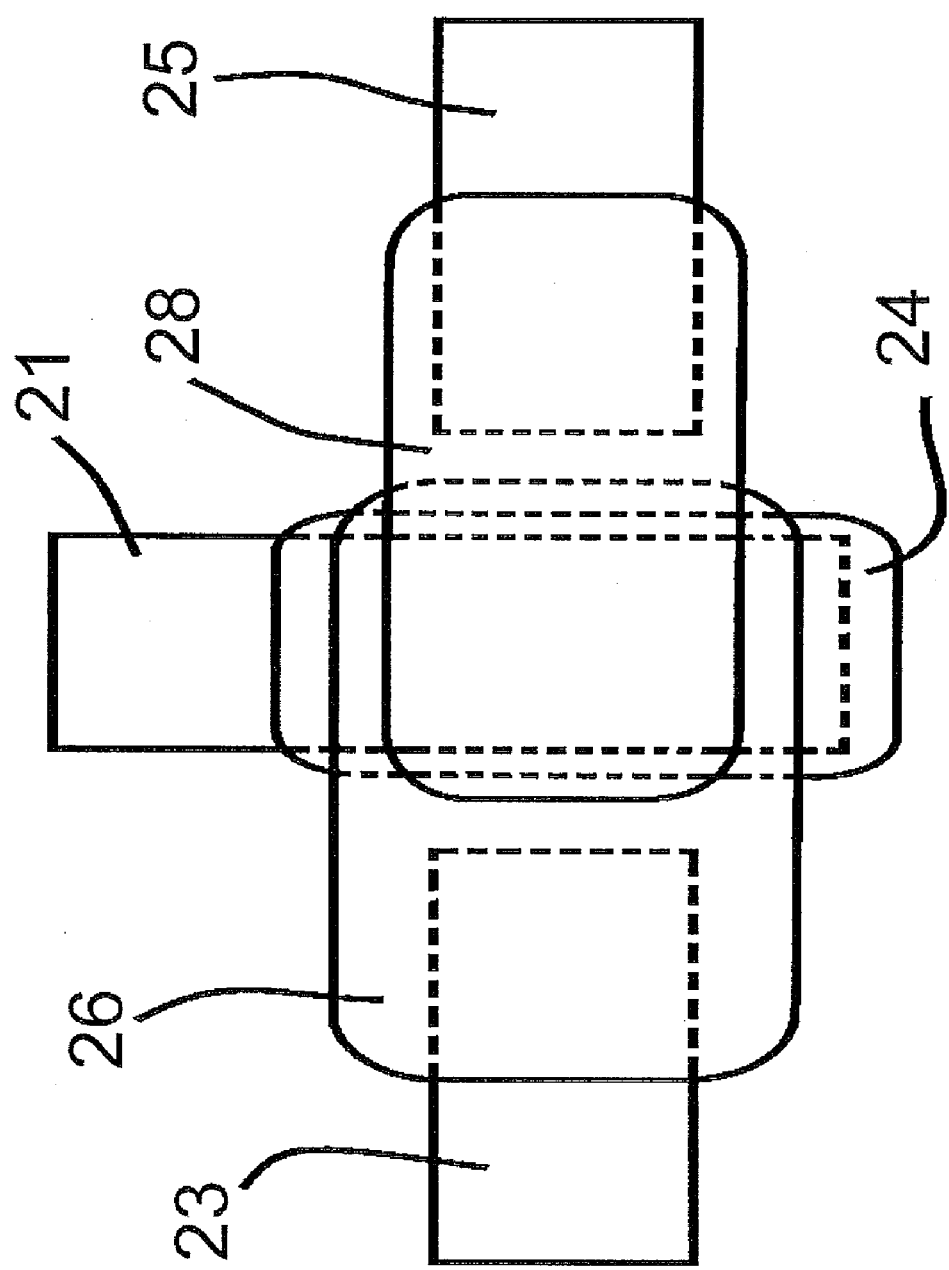
FIG. 5 is a top view of the organic transistor of FIG. 4.

Turning to FIG. 5 there is shown a top view of the transistor structure shown in FIG. 4. Although electrodes 21, 23, and 25 are shown in a "T" configuration any geometry may be used. While electrodes 21, 23, and 25 are shown projecting above the surface of substrate 29 other geometries are possible including sunk into and flush with the surface of substrate 29, or contacting layers 24, 26, and 28 from above.

Figure 6:
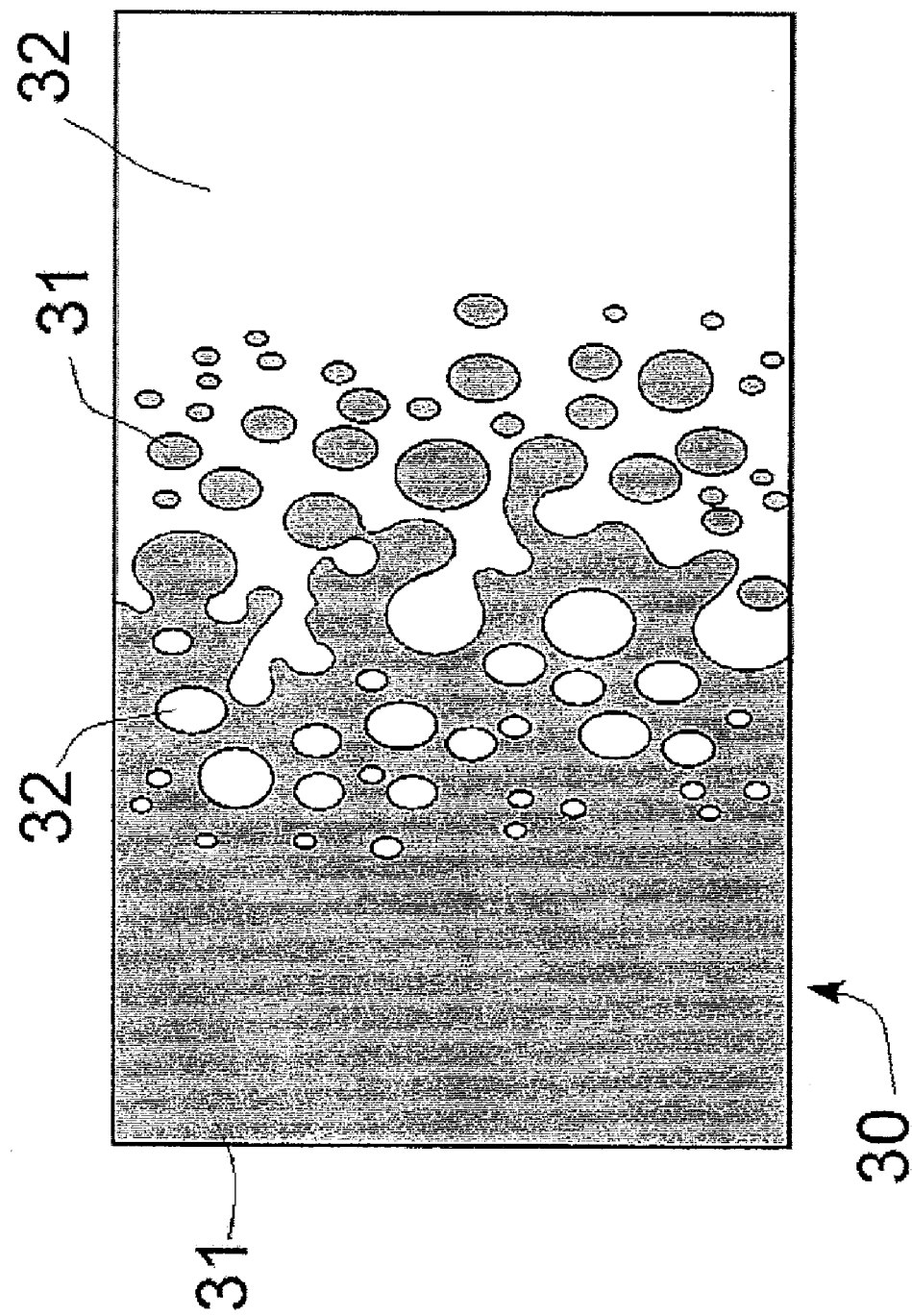
FIG. 6 is a schematic cross-sectional view of one embodiment of an interface having an indistinct boundary provided in accordance with practice of the present invention.

Turning to FIG. 6 there is shown a schematic representation of an interface having an indistinct boundary provided in accordance with practice of the present invention. In one embodiment of the diode of the present invention an indistinct boundary between two organic phases is formed where the first phase 31 is p-type and the second phase 32 is n-type. The two phase composite 30 forms a composition comprising a first conjugated organic material and an immobile donor dopant together forming the first phase 31, a second conjugated organic material which may be the same or different from the first conjugated material, and an immobile acceptor dopant together forming the second phase 32. Composite 30 may be used as a diode by providing means for electrical contact to each of the two phases.

The present invention also relates to methods for making or fabricating organic p-n junctions. The past difficulty in such construction relates in part to finding appropriate solvents for partially oxidized (or reduced) polymers that are nevertheless overall neutral, and separation of the partially oxidized (or reduced) polymers from any byproducts.

In one embodiment of the invention, the polymers are self-doped. That is, the counter ion to the partially oxidized or reduced organic matrix is chemically attached to the organic matrix (e.g., the polymer chain if the organic matrix is a polymer). The following general steps may be used to prepare self-doped polymer p-n junctions according to one embodiment of the invention:

1) Prepare conjugated polymers having appended anions and cations,

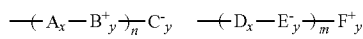

where A and D are conjugated repeat units, $B^+$ is a cationic repeat unit or repeat unit with an appended cation, $C^-$ is a small anion, $E^-$ is an anionic repeat unit or a repeat unit with an appended anion, $F^+$ is a small cation, m and n are the degree of polymerization, and x and y are mol fractions where x+y=1. It should be understood that the formula is not meant to imply any particular polymer structure, e.g., linear, branched, random, and the like.

2) Reduce the first polymer by treating a solution or suspension of it with a reductant Rd in accordance with the following formula:

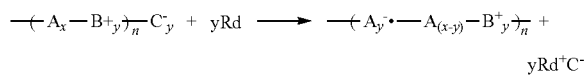

The reduced polymer ($-A_y^-\cdot-A_{(x-y)}-B_{y'}^+-$) is essentially neutral since the y repeat units with negative charge balance the y repeat units with positive charge. Because the repeat units are conjugated, the radical anion can hop or travel from one repeat unit A to others, on the same chain or on other chains. As a result, the reduction reaction detailed above results in y moles of a salt byproduct $Rd^+C^-$, which in general will have different solubility properties than the reduced polymer. The differences in solubility may in turn be used to separate the reduced polymer from the byproduct.

For example, if a solvent is selected in which the polymer is soluble and the salt is not, the salt may be filtered off leaving a solution of the reduced polymer. If the salt is soluble and the polymer is insoluble then the polymer may be filtered off and washed, and dissolved in a second solvent. Similarly, the polymer having anionic groups may be oxidized to give an oxidized polymer and a salt byproduct.

In another embodiment, the doped polymers are made by treating a neutral conjugated polymer with a relatively large, neutral doping agent, such that the doping agent oxidizes or reduce the polymer according to the following formulas:

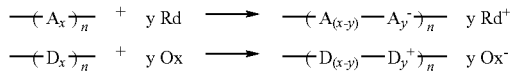

In such an embodiment, the reduced form of the oxidant has a negative charge and acts as a counter ion to the oxidized polymer. Because the oxidant was chosen to be large (i.e., greater than 500 daltons, preferably greater than 1,000 daltons) it is immobile in the polymer matrix. Similarly, the oxidized form of the reductant has a positive charge and acts as a counter ion to the reduced polymer, again being large and immobile.

One will appreciate that if the reductant is a one electron reductant, then either the reduced or oxidized form will have one unpaired electron. It is preferred for the dopant not to have an unpaired electron, since these species are in general less stable than closed shell molecules. However, either may be used for the purposes of the present invention.

For example, a one electron reductant doping agent having an unpaired electron may be a zwitterion of the general type:

where the group $Rd^-\cdot$ is a radical anion and the group $B^+$ is a cation.

Similarly, a one electron oxidant doping agent may be a zwitterion of the general type:

Non-limiting examples of zwitterionic doping agents are:

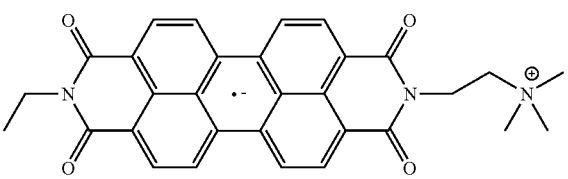

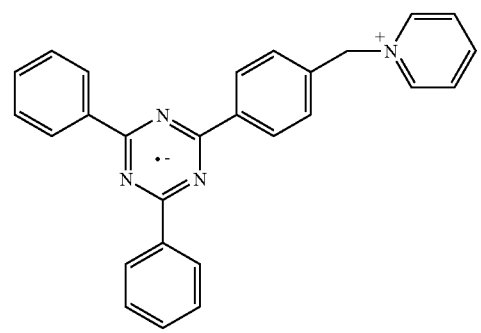

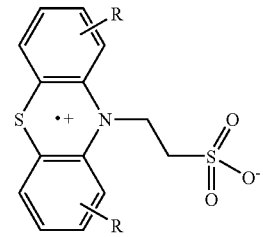

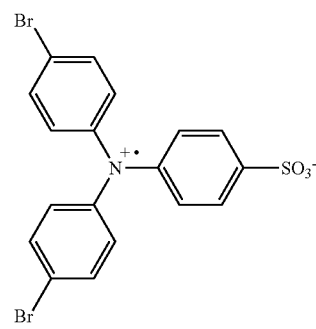

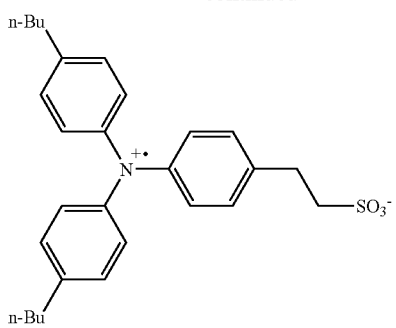

Alternatively, the doping agent may be a metal complex. It is preferable for the metal complex doping agent to be uncharged, and the product metal complex dopant to have a single positive or negative charge. Non-limiting examples of metal complex doping agents include:

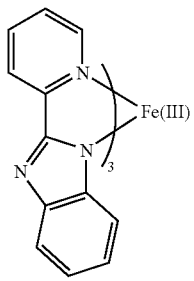 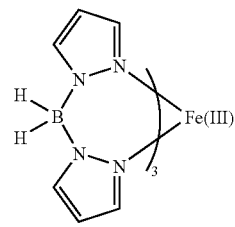

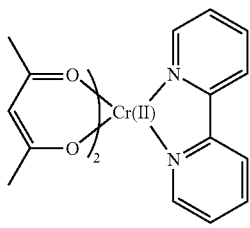 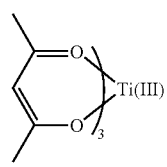

The doping agent may also be a two electron redox agent, for example (2,4-dinitrophenyl)peroxide:

ROOR→2RO⁻−2e⁻

R=dinitrophenyl or dialkyldisulfide:

RSSR→2RS⁻−2e⁻

R=alkyl

In this case both doping agent and dopant may be closed shell species.

A non-limiting example of a homojunction diode prepared from a conjugated polymer and zwitterion dopants is:

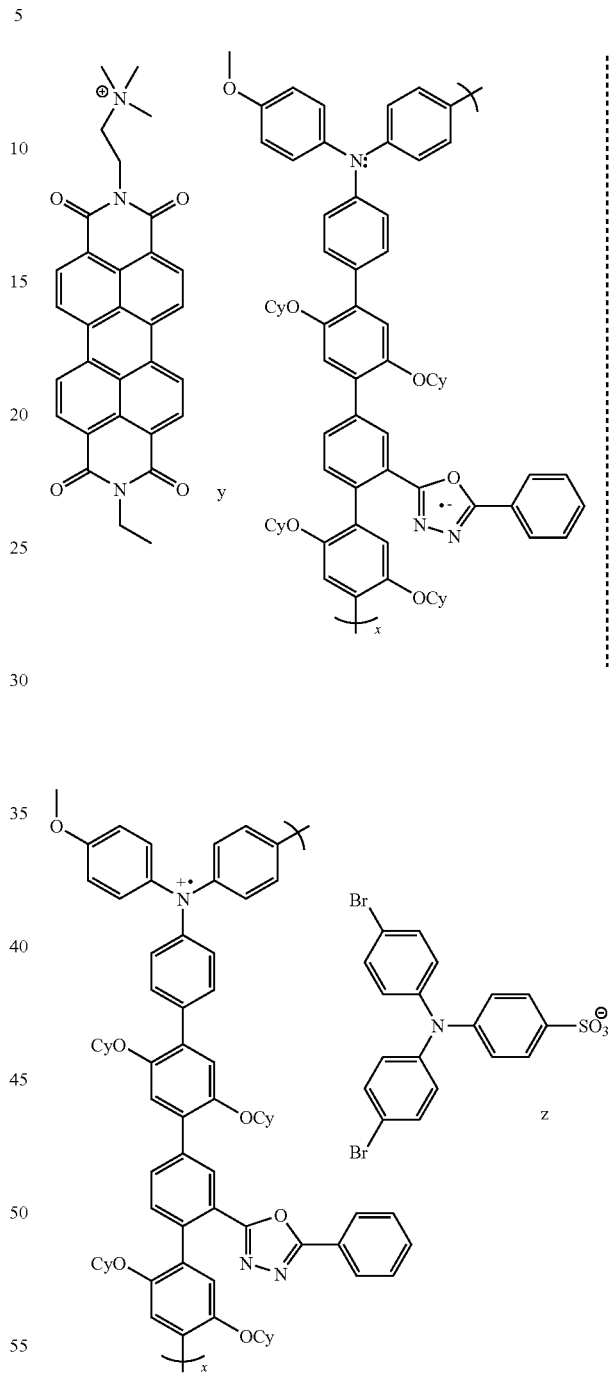

In the p-n homojunction as depicted above Cy is cyclohexyl, y is the mole fraction of donor dopant relative to reducible repeat units, and z is the mole fraction of acceptor dopant relative to oxidizable repeat units. Although the polymer is shown with one full charge per repeat unit, typically y and z will be small numbers and only a small fraction of the repeat units will be charged. Preferably y and z will be independently between 0.5 and 0.00001, more preferably between 0.1 and 0.00005, even more preferably between 0.01 and 0.0001, although higher or lower amounts may be used.

A non-limiting example of a p-n heterojunction provided in accordance with the practice of the present invention is:

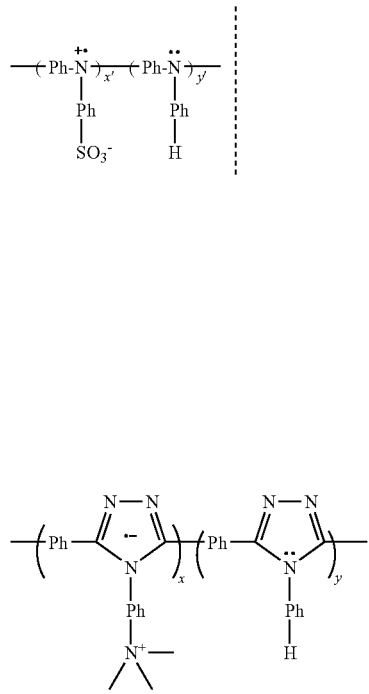

where Ph is the divalent 1,4-phenylene group, x and y are the mole fractions of reduced and neutral repeat units in the n-type polymer respectively, x' and y' are the mole fractions of oxidized and neutral repeat units in the p-type polymer respectively, and x+y=x'+y'=1. Typically x and x' will be small numbers and only a small fraction of the repeat units will be charged. Preferably x and x' will be independently between 0.5 and 0.00001, more preferably between 0.1 and 0.00005, even more preferably between 0.01 and 0.0001, although higher or lower amounts may be used.

The p-n junctions of the present invention may be sensitive to water. Because a large electric field is present at the junction, and because polymers are in general permeable to water, water may diffuse to the junction and cleave heterolytically to form $H^+$ and $OH^-$. Water should be avoided in the use of the present invention. One skilled in the art will know how to remove water during polymer synthesis and device fabrication, as well as encapsulate or hermetically seal devices, and employ scavengers to remove water.

Because the reaction and diffusion of water is reversible, in one embodiment the p-n junctions of the present invention may be prepared by first forming a bilayer of an acid form polymer and a base form polymer, whereupon an acid-base salt will form at the junction with the release of water. A built-in potential forms at the junction. In a second step the bilayer is dehydrated, increasing the potential. As the potential becomes greater than the difference between the oxidizing potential of the donor on one side and the reducing potential of the acceptor on the other side of the junction, electron transfer will occur resulting in formation of charge carriers.

One exemplary embodiment of a method of forming such a junction is shown below:

Step 1 bilayer and salt formation:

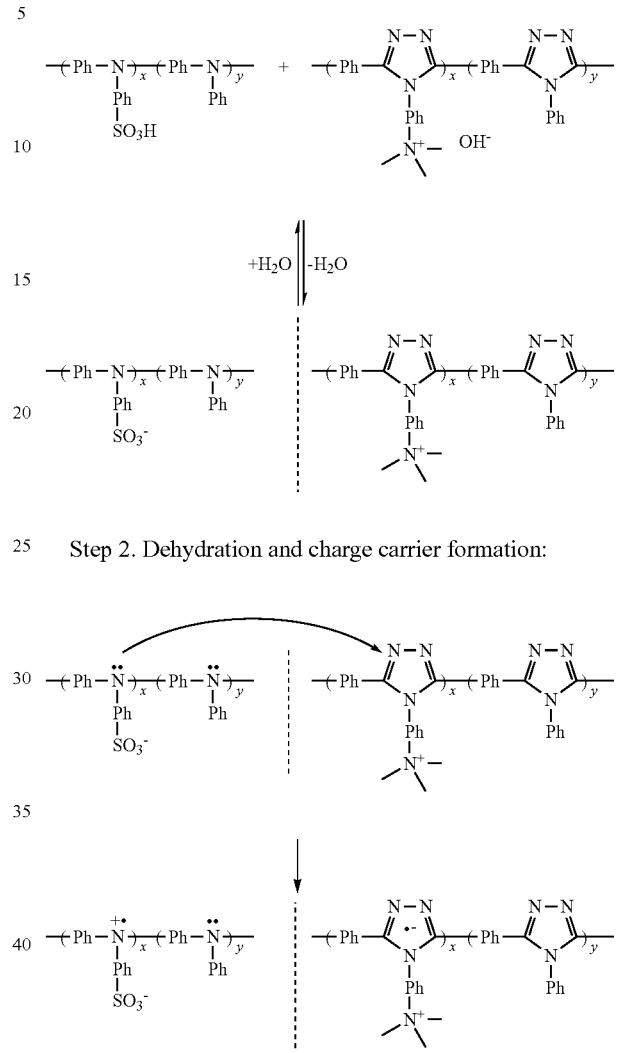

Step 2. Dehydration and charge carrier formation:

Although not shown, charge carriers are forced apart by the built in potential and swept away from the junction.

It should be understood that the p-n junctions of the present invention may also be sensitive to oxygen. Because the n-type polymers are reducing, and because polymers are in general permeable to oxygen, oxygen may diffuse to the junction and oxidize the n-doped polymer. Accordingly, oxygen should be avoided in the use of the present invention. One skilled in the art will know how to remove oxygen and air during polymer synthesis and device fabrication, as well as encapsulate or hermetically seal devices, and employ scavengers to remove oxygen.

The p-n junctions of the present invention may also be used as photovoltaic cells or photodiodes. In this application it is desirable for at least one of the organic materials to absorb light, especially in the visible region of about 350 nm to 700 nm. For use as a solar cell it is desirable that the visible absorption be very broad with a significant extinction coefficient (about $10^2$ to $10^5$ liter mole$^{-1}$ cm$^{-1}$) across the visible range. Suitable molecules and substances that absorb light may include dyes or pigments. Such molecules or parts of molecules are also called chromophores. For the purposes of the present invention chromophores may be introduced into devices in several ways, including: 1) where the organic matrix is itself a chromophore, 2) where the organic matrix has chemically appended chromophores, and 3) where a chromophore is blended or mixed into the matrix. Alternatively, the dopant(s) may also function as chromophores.

In a solar cell it is desirable to absorb as much of the incident light as possible as near to the p-n junction as possible. Therefore, the extinction coefficient of the material in the device should be as high as possible. If the extinction coefficient is high enough it is desirable to have the chromophore present near the p-n junction and absent further away from the junction. For example, a junction comprising a 0.5 micron p-type layer, and a 0.4 micron n-type layer, might have only a 0.04 micron thick region of the p-type layer nearest the junction containing a chromophore. Alternatively, a junction comprising a 0.5 micron p-type layer, and a 0.5 micron n-type layer, might have a 0.10 micro layer of a chromophore interposed between the two. If the chromophore layer is not doped it may be considered an intrinsic semiconductor and the structure will be a p-i-n diode.

In one embodiment of a photosensitive device a single molecule may function as the conjugated matrix and the chromophore. If the matrix is oliomeric or polymeric the chromophore may be a repeat unit in the polymer main chain, it may be a side group or end group, or it may be blended or dissolved into the polymer. The chromophore may be the only repeat unit in the polymer chain (homopolymer) or it may be part of a copolymer.

It will be recognized by one skilled in the art that conjugated polymers often have higher extinction coefficients in the visible spectrum when they are doped relative to the undoped polymer (although there are exceptions such as polythiophene). The extinction coefficients of the p- and/or n-doped polymer may be great enough that additional dyes or chromophores are not necessary for an efficient photovoltaic response. The absorption spectrum of the doped polymer and the action spectrum of the p-n junction, both relative to the doping level, are important criteria in the design of efficient solar cells of the present invention.

To achieve efficient conversion of light into electricity it is necessary to consider the optical and electronic properties of the organic matrix and the chromophore. While not wishing to be bound by theory, the p-type matrix, the n-type matrix, and the chromophore each has a band gap, and a particular energy for the top of the valence band and bottom of the conduction band. Or in chemical terms, a particular energy for the highest occupied molecular orbital (HOMO) and lowest unoccupied molecular orbital (LUMO). At a p-n junction at equilibrium the built in potential will cause these levels to adjust so that the chemical potential of electrons (also called the fermi level) is uniform throughout. The matching of fermi levels across the p-n junction is just another way to look at the formation of the built in potential. The situation is well understood for inorganic p-n junctions and is qualitatively the same for doped organic p-n junctions.

For example, in a case where the doped organic matrix itself is the only chromophore present the band diagram is the standard p-n junction diagram. In a case where the chromophore is electronically separate from the organic matrix (not necessarily chemically separate) it may be represented separately in the band diagram:

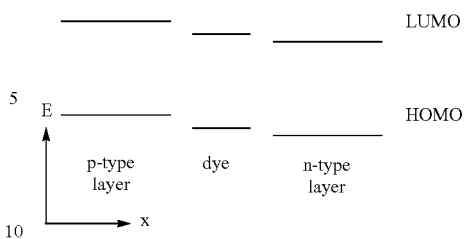

As shown above the HOMO of the dye (or other chromophore) is preferably located between the HOMO of the p-type and n-type layer. The LUMO of the dye is preferably located between the LUMO of the p- and n-type layers. When the dye absorbs a photon an electron is raised to the dye's LUMO leaving a hole in its HOMO. If the dye LUMO is between the p-type layer's and n-type layer's LUMO the excited electron will tend to drop into the n-type LUMO, since transfer up to the p-type LUMO is not energetically favorable. Similarly, the excited hole in the dye HOMO will transfer selectively to the p-type layer if the HOMOs are arranged as depicted. The band gaps of the p- and n-type materials may also be larger than the dye band gap as shown below.

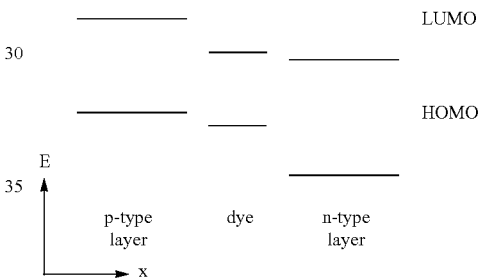

In such an embodiment, light of different wavelengths may be absorbed in each layer and contribute to a photocurrent.

The chromophore layer may be essentially pure chromophore, or may be comprised of a chromophore plus other materials, e.g., a polymer binder, additional chromophores, or other additives. The chromophore may also be part (e.g., a repeat unit or side group) of a polymer or copolymer. The thickness of the chromophore layer must be chosen to balance two opposing factors: 1) the chromophore layer is desired to be thin to avoid resistive and quenching losses, and 2) the chromophore layer is desired to be thick to ensure absorption of all incident photons. Typically, some thickness will provide the best balance between quenching and absorption and give the best performance.

One can determine the optimal thickness by measuring performance (e.g., efficiency or maximum power output) as a function of chromophore thickness in a series of devices. The chromophore layer is preferably between one monolayer and 500 nm thick, more preferably between about two monolayers and 100 nm thick, even more preferably between about 3 monolayers and 50 nm thick, and most preferably between about 4 monolayers and 10 nm thick.

Additional layers may also be present including exciton blocking layers, charge transport layers, additional semiconducting layers, barrier layers, tunnel layers, reflective or anti-reflective layers, alignment layers for inducing crystallinity in a preferred direction, or other functional layers.

Non-limiting examples of dyes and pigments, or chromophores include: metal complexes of bipyridines, and phenanthrolines, metal cyanide complexes and compounds, metallated or non-metallated macrocycles including porphyrins, azaporphyrins, phthalocyanins, expanded porphyrins and cyclic polypyrroles including sapphyrins and texaphyrins, dibenzotetraazaannulenes, chlorophylls, and chlorophyllins, cyanine dyes, fluorescein dyes, indigo type dyes, phenothiazine dyes, viologen dyes, carbon, and nano-particle pigments such as cadmium chalcogenides, zinc chalcogenides, titanium chalcogenides, and the like.

Non-limiting, particular examples of dyes or chromophores include: ruthenium(II) tris(bipyridine), Ru(4,4'-dicarboxylic acid-2,2'-bipyridine)$_2$(NCS)$_2$, iron(II) trisbipyridine, iron(II) trisphenanthroline, prussian blue, $C_{60}$, $Ru_2(CN)_6$, zinc tetraphenylporphyrin, iron octakiscarboxylic acid ethyl ester phthalocyanin, cobalt sapphyrin, iron hexaethyltexaphyrin, $H_2$ dibenzo-1,4,8,11-tetraaza-14-annulene, magnesium chlorophyll, copper chlorphyllin, merocyanin, fluorescein, indigo, methylene blue, paraquat, cadmium selenide, zinc sulfide, titanium sulfide and the like.

EXAMPLES

Example 1

Acceptor Zwitterion

Preparation of sodium 4,4'-dibromotriphenylamine-4"-sulfonate

A solution of 4,4'-dibromotriphenylamine (10 g) in 100 ml conc. sulfuric acid is cautiously poured into 1 liter ice water. The mixture is then extracted with two 100 ml portions of dichloromethane. The organic layers are combined and washed with three 100 ml portions of water. The organic layer is then treated with one equivalent of sodium hydroxide as a 0.2 M aqueous solution. The water is removed under reduced pressure to give crude sodium 4,4'-dibromotriphenylamine-4"-sulfonate.

Preparation of 4,4'-dibromotriphenylamine-4"-sulfonate zwitterion radical

The crude sodium 4,4'-dibromotriphenylamine-4"-sulfonate (0.49 g) is dispersed in 2 liter anhydrous THF at room temperature in an inert atmosphere glove box. To the resultant mixture is added nitrosonium tetrafluoroborate (0.11 g). The mixture is filtered to remove the byproduct sodium tetrafluoroborate and any remaining starting material. The resulting solution of Acceptor Zwitterion may be used as is.

Example 2

Donor Zwitterion

Preparation of perylene tetracarboxylic acid monoanhydridemono-N-butylimide, PTBI A three neck 250 ml round-bottomed flask is charged with 1 ml butylamine, 6 ml triethylamine, and 50 ml water. The flask is fitted with a reflux condenser. The reaction mixture is cooled to 0° C. under an atmosphere of nitrogen and perylene tetracarboxylic acid monoanhydride monopotassium salt (H. Troster, *Dyes and Pigments,* 1983, 4, 171-177) (4.48 g) is added with stirring. After stirring for 1 hr at 0° C. the mixture is brought to room temperature and stirred under nitrogen for 48 hr. The mixture is brought to reflux for 2 hr, cooled to about 50° C., acidified with 15 ml 20% aq HCl, and brought to reflux again for 2 hr. A red solid is collected by filtration, mixed with 10% aq KOH (50 ml) and heated to 90° C. for 2 hr. Potassium chloride (40 g) is added and the resulting mixture cooled to 0° C. and filtered. The solids are suspended in an aqueous solution 8% in KCl and 2% in $K_2CO_3$, stirred, and filtered. The solids are washed with this solution until the filtrate no longer fluoresces green. The solids are then suspended in 250 ml water and heated to 90° C. for 2 hr. This solution is filtered and the reddish filtrate acidfied with conc HCl. The solution is heated again to 90° C. for 15 min, filtered and air dried.

Preparation of perylene tetracarboxylic acid N'-butylimide-N-(2-trimethylammoniumethyl)imide chloride, PTBITI The monoanhydride PTBI (0.895 g, 2 mmol), (2-aminoethyl)trimethylammonium chloride hydrochloride (0.39 g, 2.2 mmol), pyridine (50 ml), and a magnetic stir bar are sealed in a glass pressure tube. The sealed tube is heated with stirring to 100° C. for 24 hr. The solvent is then removed under reduced pressure. The crude product is then purified by column chromatography with methanol/methylene chloride eluent.

Preparation of perylene tetracarboxylic acid N-(2-trimethylammoniumethyl)imide-N'-butylimide radical zwitterion, PZ The purified PTBITI (0.2 g) is dispersed in 1 liter anhydrous THF at room temperature in an inert atmosphere glove box. To the resultant mixture is added sodium metal (0.05 g). After stirring for several hours the solution takes on a blue color indicating the desired perylene radical anion is formed. The mixture is filtered to remove NaCl, any dianion, and any remaining starting materials. The resulting solution of Donor Zwitterion may be used as is.

Example 3

Poly(1,4-(2,5-dihexyloxyphenylene)-4,4'-triphenylaminediyl), Polymer 1

Working in an inert atmosphere dry-box the following reagents were combined in a 40 ml glass vial: 1,4-(bis-boronic acid ethyleneglycol ester)-2,5-dihexyloxybenzene (0.1631 g, 0.390 mmol), 4,4'-dibromotriphenylamine (0.1456 g, 0.361 mmol), palladium tetrakistriphenylphosphine (0.7 ml of a solution of 60 mg in 5 ml toluene), toluene (1.55 ml), and Aliquat 336 (tricaprylylmethylammonium chloride) (0.75 ml of a 60% solution (wt/wt) in toluene). The vial was sealed with a cap fitted with a rubber septum and removed from the dry-box. An aqueous solution 2 M in $K_2CO_3$ (1.5 ml) was added by syringe and the vial heated in an orbital shaker held at 95° C. for 24 h. A sample of the polymer dope was analyzed by GPC against polystyrene standards to give Mn 10,874; Mw 35,283; PDI 3.24. The organic layer was coagulated twice into methanol. The solid was collected by vacuum filtration.

Example 4

Poly(1,4-(2,5-dihexyloxyphenylene)-1,4-phenyloxadiazolylphenylene), Polymer 2

2,5-Dibromodiphenyloxadiazole

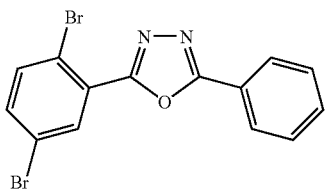

To a 250 ml round bottom flask was added 2,5-dibromobenzoic acid (28 g, 0.1 mol) and $SOCl_2$ (100 ml). The dibromobenzoic acid did not completely dissolve. The mixture was heated to 90° C. under $N_2$ for 5 h, then cooled to RT. Excess thionyl chloride was removed by vacuum distillation. The product was then distilled under vacuum to yield 21 g of white solid.

The 2,5-dibromobenzoyl chloride (21 g, 73 mmol) prepared above was place in a three neck 250 ml round bottom flask along with phenyltetrazole (16 g, 110 mmol) and pyridine (anhydrous) (50 ml). The mixture was heated to 120° C. under $N_2$ whereupon fast gas evolution occurred. After 30 min gas evolution ceased, the reaction mixture was cooled to RT and pyridine removed under vacuum (rotovap). The remaining material was dissolved in 300 ml methylene chloride and passed through a silica gel column (50 mm dia.×150 mm) and eluted fractions containing pure product combined and stripped of solvent to yield 24 g of solid 2,5-dibromodiphenyloxadiazole (m.p. 131-133° C.).

Poly(1,4-(2,5-dihexyloxyphenylene)-1,4-phenyloxadiazolylphenylene), Polymer 2

Working in an inert atmosphere dry-box the following reagents were combined in a 40 ml glass vial: 1,4-(bis-boronic acid ethyleneglycol ester)-2,5-dihexyloxybenzene (0.2374 g, 0.568 mmol), 2,5-dibromodiphenyloxadiazole (0.1976 g, 0.52 mmol), palladium tetrakistriphenylphosphine (12 mg, added as 1 ml of a solution of 60 mg in 5 ml toluene), toluene (0.65 ml), and Aliquat 336 (tricaprylylmethylammonium chloride) (0.35 ml of a 60% solution (wt/wt) in toluene). The vial was sealed with a cap fitted with a rubber septum and removed from the dry-box. An aqueous solution 2 M in $K_2CO_3$ (0.8 ml) was added by syringe and the vial heated in an orbital shaker held at 95° C. for 38 h. A sample of the polymer dope was analyzed by GPC against polystyrene standards to give Mn 12,585; Mw 52,284; PDI 4.15. The organic layer was coagulated twice into methanol, filtered and dried under vacuum to yield Polymer 2 as an off-white solid.

Example 5

Poly(1,4-(2,5-dihexyloxyphenylene)-4,4'-diphenyloxadiazolediyl-co-1,4-(2,5-dihexyloxyphenylene)-4,4'-triphenylaminediyl), Polymer 3

Preparation of 1,4-(bis-boronic acid ethyleneglycol ester)-2,5-dihexyloxybenzene To a 250 ml single neck round bottom flask was added 1,4-(bis-boronic acid)-2,5-dihexyloxybenzene (12.9 g, 35 mmol) and ethylene glycol (19.5 ml 350 mmol). A reflux condensor was attached and the mixture was heated to 120°-150° C. under nitrogen for 2 h. After cooling to room temperature (RT) 20 ml toluene was added. A Dean-Stark receiver was connected and the mixture heated until about 20 ml of toluene and water were collected. After condensation stopped the mixture was cooled to RT the flask connected to a vacuum adapter and excess ethylene glycol distilled off at about 120° C. The flask was cooled to RT and the solid collected and dissolved in 20 ml anhydrous methylene chloride. Hexanes, anhydrous, was slowly added (about 80 ml). The flask was placed into the freezer. A white crystalline solid precipitated out, was filtered, washed with hexanes and vacuum dried to give 9.3 g (64%).

Preparation of poly(1,4-(2,5-dihexyloxyphenylene)-4,4'-diphenyloxadiazolediyl-co-1,4-(2,5-dihexyloxyphenylene)-4,4'-triphenylaminediyl), Polymer 3

Working in an inert atmosphere dry-box the following reagents were combined in a 40 ml glass vial: 1,4-(bis-boronic acid ethyleneglycol ester)-2,5-dihexyloxybenzene (0.2174 g, 0.52 mmol), 4,4'-dibromotriphenylamine (0.104 g, 0.26 mmol), 4,4'-dibromodiphenyloxadiazole (0.099 g, 0.26 mmol) (C. C. Walker and H Shechter, *J. Am. Chem. Soc.*, 1968, 90, 5626-5627) palladium tetrakistriphenylphosphine (12 mg, added as 1 ml of a solution of 60 mg in 5 ml toluene), toluene (0.65 ml), and Aliquat 336 (tricaprylylmethylammonium chloride) (0.35 ml of a 60% solution (wt/wt) in toluene). The vial was sealed with a cap fitted with a rubber septum and removed from the dry-box. An aqueous solution 2 M in $K_2CO_3$ (0.8 ml) was added by syringe and the vial heated in an orbital shaker held at 95° C. overnight. A sample of the polymer dope was analyzed by GPC against polystyrene standards to give Mn 17,278; Mw 45,016; PDI 2.60. The organic layer was coagulated into methanol, the solids redissolved in toluene and coagulated a second time into methanol. Polymer 3 as a green solid was collected by vacuum filtration.

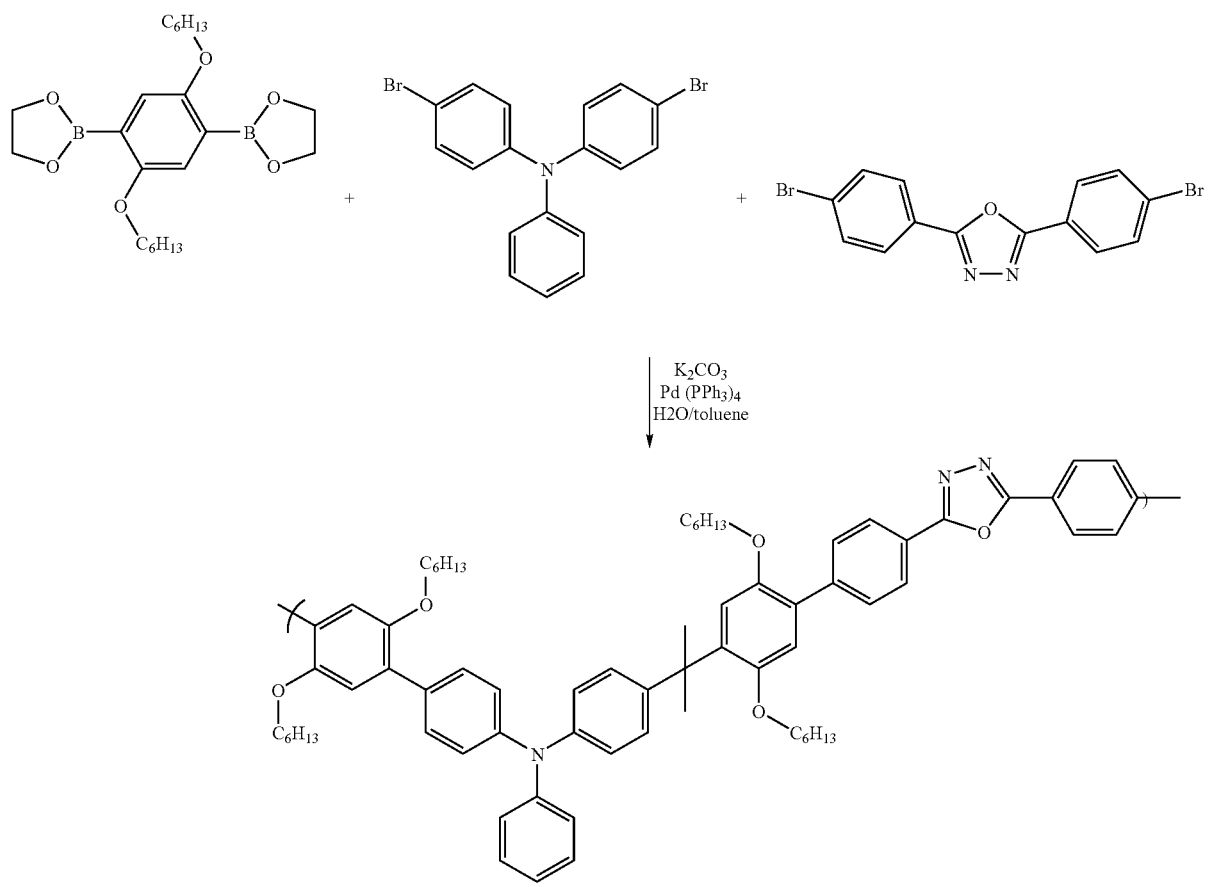

Example 6

Sulfonated Poly(1,4-(2,5-dihexyloxyphenylene)-4,4'-triphenylaminediyl), Polymer 4

Polymer 1 (1.2 g) is stirred with 20 g sulfolane with gentle heating for 8 h. To this mixture is added 0.25 ml of a solution of $SO_3$ in sulfolane (8 g in 100 ml) at room temperature and stirred for an additional 16 h. The mixture is poured into isopropanol (100 ml) to precipitate the polymer, which is filtered, washed with isopropanol and hexane, and dried in a vacuum oven at 100° C. overnight to give Polymer 4 in the acid form as a dry powder. The sulfonic acid content may be measured by stirring a known quantity of polymer with a known amount of a standard aqueous sodium hydroxide solution, and back titrating with acid.

Polymer 4 (0.5 g) is treated with 0.5 M aqueous sodium hydroxide and stirred overnight. The polymer is then filtered, washed with water until the washings are neutral, and dried in a vacuum oven at 100° C. overnight to give Polymer 4 in the sodium salt form.

The sodium salt form of Polymer 4 prepared above (about 0.5 g) is suspended in 25 ml methylene chloride. To this mixture is added nitrosonium tetrafluoroborate (11.6 mg, 0.1 mmol). This addition and all further manipulations are done under inert atmosphere. The mixture is stirred under a nitrogen atmosphere for 24 h. The solids are filtered off and the filtrate used for spin coating films of self-doped Polymer 4.

Example 7

Hetero p-n Junction

An ITO coated glass (40 ohms/square) substrate is cleaned in an ultrasonic bath with acetone, then treated with an oxygen plasma. The cleaned substrate is spin coated with Polymer 1 (see Example 3 above) at spin rates of 200 to 2000 rpm and adjusting the concentration of Polymer 1 to determine conditions for yielding a thickness of 100 to 200 nm. Under inert atmosphere a solution of Polymer 1 is mixed with a solution of Acceptor Zwitterion from Example 1 above such that there is 0.05 equivalents of Acceptor Zwitterion for each 1 equivalent of triarylamine repeat unit in solution and the concentration is suitable for spin coating (approximately 0.1 to 1 g/L). This mixture is used to spin coat a 150±20 nm film of doped Polymer 1 onto a cleaned ITO coated glass substrate. The coated substrate is heated to 100° C. in a vacuum for 15 min, held under vacuum at RT for 24 h, and returned to the inert atmosphere environment.

Under inert atmosphere a solution of Polymer 2 (see Example 4 above) is mixed with a solution of Donor Zwitterion from Example 2 above such that there is 0.05 equivalents of Donor Zwitterion for each 1 equivalent of oxadiazole repeat unit in solution and the concentration is suitable for spin coating. This mixture is used to spin coat a 150±20 nm film of doped Polymer 2 onto the previously deposited layer of Polymer 1. The coated substrate is again dried at 100° C. in a vacuum for 10 min then held under vacuum at RT for 24 h. An aluminum electrode (500 nm) is deposited by vacuum evaporation.

When the resulting device is illuminated with 100 mW/cm² white light a photovoltage develops between the ITO and Al electrodes.

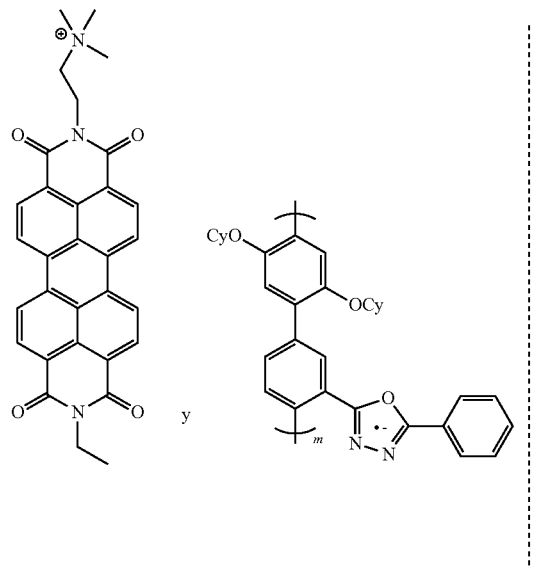
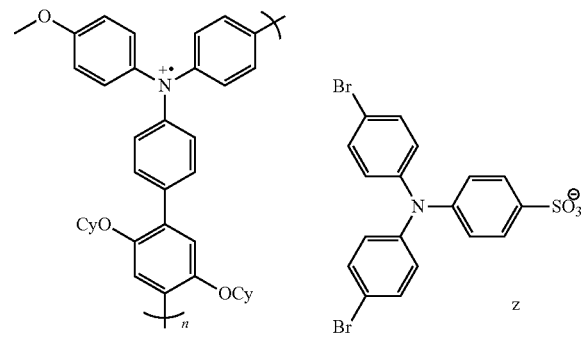

Schematic representation of the homojunction p-n junction of Example 7.

Example 8

Hetero p-n Junction

Same as Example 7 except that a thin layer of Baytron P (Bayer AG, Germany) is spin coated (1500 rpm) onto the cleaned ITO, and dried at 150° C. for 30 min under vacuum, prior to deposition of Polymer 1.

Example 9

Hetero p-n Junction

Same as Example 7 except that the substrate is ITO on polyester, cleaned by washing with isopropanol, and instead of spin coating the polymer solutions are spray coated under conditions of concentration and spray duration to provide films between 100 and 350 nm thick.

Example 10

Polymeric Chromophore

Preparation of poly(1,4-(2,5-dihexyloxyphenylene)-5,15-(10,20-diphenylporphinato)zinc diyl), Polymer 7

Working in an inert atmosphere dry-box the following reagents are combined in a 40 ml glass vial: 1,4-(bis-boronic acid ethyleneglycol ester)-2,5-dihexyloxybenzene (0.2374 g, 0.568 mmol), 5,15-dibromo-10,20-diphenylporphinato)zinc (S. G. DiMagno, V. S.-Y. Lin, and M. J. Therien, *J. Org. Chem.*, 1993, 58, 5983-5993) (0.3883 g, 0.568 mmol), palladium tetrakistriphenylphosphine (12 mg), potassium carbonate (0.23 g), and anhydrous DMF (3 ml). The vial is sealed with a cap fitted with a rubber septum and removed from the dry-box and heated in an orbital shaker held at 95° C. for 38 h. The organic layer is coagulated twice into methanol, filtered and dried under vacuum to yield Polymer 7 as a dark powder.

Example 11

Hetero p-n Junction Roll-to-Roll Processing

An ITO coated polyester film (roll 1 m×500 m) is fed through an apparatus with several sections and treated as follows in each section.
1) the film is washed with 95% aqueous ethanol with light non-abrasive rubbing, and air dried,
2) a 0.9 micron layer of doped Polymer 1 is applied by spray coating, in a nitrogen atmosphere, a solution of Polymer 1 mixed with a solution of Acceptor Zwitterion from Example 1 above such that there is 0.007 equivalents of Acceptor Zwitterion for each 1 equivalent of triarylamine repeat unit in solution,
3) drying by IR heating under a stream of dry nitrogen,
4) an 0.8 micron layer of doped Polymer 2 is applied by spray coating, in a nitrogen atmosphere, a solution of Polymer 2 mixed with a solution of Donor Zwitterion from Example 2 above such that there is 0.007 equivalents of Donor Zwitterion for each 1 equivalent of oxadiazole repeat unit in solution,
5) drying by IR heating under a stream of dry nitrogen
6) further drying by heating to 100° C. to 150° C. under reduced pressure,
7) vacuum evaporation of an aluminum back electrode,
8) spraying an epoxy sealing coating,
9) curing the epoxy sealing coating with heat, UV and/or e-beam.

Example 12

Hetero p-n Junction with Chromophore Layer Roll-to-Roll Processing

As in Example 11 with additional sections provided as follows:

1a) treatment with UV light and ozone to remove surface organic contamination, 3a) spraying a solution of chromophore selected from:
   a) copper octabutylphthalocyanin,
   b) zinc tetraphenylporphyrin,
   chlorophyllin,
   d) Ru(4,4'-dicarboxylic acid-2,2'-bipyridine)$_2$(NCS)$_2$,
   e) cadmium selenide/sulfide core/shell quantum dots,
   f) carbon nanorods,
   g) carbon fibrils, and
   h) $C_{60}$.
   such that a 50 to 100 nm chromophore layer results, followed by drying with IR heating under a stream of nitrogen.

Example 13

Laminated Hetero p-n Junction Roll-to-Roll Processing

An ITO coated polyester film (roll 1 m×500 m) is fed through an apparatus with several sections and treated as follows in each section.

1) the film is washed with 95% aqueous ethanol with light non-abrasive rubbing, and air dried,
2) a 0.9 micron layer of doped Polymer 1 is applied by spray coating, in a nitrogen atmosphere, a solution of Polymer 1 mixed with a solution of Acceptor Zwitterion from Example 1 above such that there is 0.0075 equivalents of Acceptor Zwitterion for each 1 equivalent of triarylamine repeat unit in solution,
3) drying by IR heating under a stream of dry nitrogen, an aluminum coated polyester film (roll 1 m×500 m) is fed through an apparatus with several sections and treated as follows in each section.
4) an 0.8 micron layer of doped Polymer 2 is applied by spray coating, in a nitrogen atmosphere, a solution of Polymer 2 mixed with a solution of Donor Zwitterion from Example 2 above such that there is 0.006 equivalents of Donor Zwitterion for each 1 equivalent of oxadiazole repeat unit in solution,
5) drying by IR heating under a stream of dry nitrogen, and
6) under an atmosphere of nitrogen the plastic sheets coated with Polymer 1 and Polymer 2 are laminated under 100 psi pressure by rolls heated to 100° C. such that the doped polymers make contact to form a p-n junction.

Example 14

Laminated Hetero p-n Junction with Chromophore Layer Roll-to-Roll Processing As in Example 13 with additional sections provided as follows 1a) treatment with UV light and ozone to remove surface organic contamination, 3a) spraying a solution of chromophore selected from:
   a) copper octabutylphthalocyanin,
   b) zinc tetraphenylporphyrin,
   chlorophyllin,
   d) Ru(4,4'-dicarboxylic acid-2,2'-bipyridine)$_2$(NCS)$_2$,
   e) cadmium selenide/sulfide core/shell quantum dots,
   f) carbon nanorods,
   g) carbon fibrils, and
   h) $C_{60}$
   such that a 50 to 100 nm chromophore layer results, followed by drying with IR heating under a stream of nitrogen.

Example 15

Homojunction Diode

An ITO coated glass (40 ohms/square) substrate is cleaned in an ultrasonic bath with acetone, then treated with an oxygen plasma. The cleaned substrate is spin coated with Polymer 3 (see Example 5 above) at spin rates of 200 to 2000 rpm and adjusting the concentration of Polymer 3 to determine conditions for yielding a thickness of 100 to 200 nm. Under inert atmosphere a solution of Polymer 3 is mixed with a solution of Acceptor Zwitterion from Example 1 above such that there is 0.005 equivalents of Acceptor Zwitterion for each 1 equivalent of triarylamine repeat unit in solution and the concentration is suitable for spin coating (approximately 0.1 to 1 g/L). This mixture is used to spin coat a 150±20 nm film of doped Polymer 3 onto a cleaned ITO coated glass substrate. The coated substrate is heated to 100° C. in a vacuum for 15 min, held under vacuum at RT for 24 h, and returned to the inert atmosphere environment.

Under inert atmosphere a solution of Polymer 3 is mixed with a solution of Donor Zwitterion from Example 2 above such that there is 0.005 equivalents of Donor Zwitterion for each 1 equivalent of oxadiazole repeat unit in solution and the concentration is suitable for spin coating. This mixture is used to spin coat a 150±20 nm film of doped Polymer 3 onto the previously deposited layer of Polymer 3. The coated substrate is again dried at 100° C. in a vacuum for 10 min then held under vacuum at RT for 24 h. An aluminum electrode (500 nm) is deposited by vacuum evaporation.

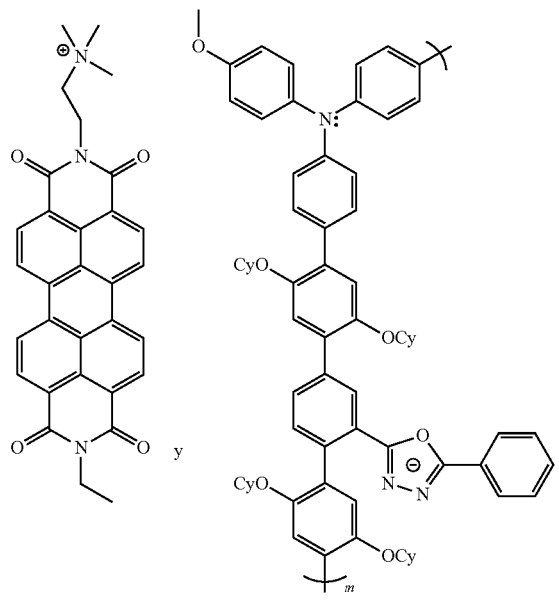

Schematic representation of the homojunction p-n junction of Examples 14-15.

When the resulting device is illuminated with 100 mW/cm$^2$ white light a photovoltage develops between the ITO and Al electrodes.

Example 16

Homojunction p-n Junction

As in Example 13 except that Polymer 3 is used to replace Polymer 1 and Polymer 2.

Example 17

Homojunction p-n Junction

As in Example 14 except that Polymer 3 is used to replace Polymer 1 and Polymer 2.

Example 18

Organic Transistor

A pnp transistor is fabricated on a glass substrate by:
1) Vacuum evaporating a layer of aluminum (0.8 micron) and patterning, using standard lithographic techniques, into three electrodes 10 microns wide and 5 mm long in a "T" configuration (see FIG. 5), such that the side arm electrodes of the "T" each make a gap of 4 microns with the center electrode, and the center electrode extends 6 microns beyond the edges of the side electrodes,
2) a bottom 500 nm p-type layer 24 is deposited by spray deposition through a mask from a solution of doped Polymer 1 as used in Example 7 to cover a roughly rectangular area 14×24 microns positioned such that the end of electrode 21 is covered with a border extending 2 microns over the edges of electrode 21, and dried in a vacuum oven,
3) a middle 500 nm n-type layer 26 is deposited by spray deposition through a mask from a solution of doped Polymer 2 as used in Example 7 to cover a roughly rectangular area 18×36 microns overlapping electrode 23 and bottom p-layer 26, and dried in a vacuum oven,
4) a top 500 nm p-type layer 28 is deposited by spray deposition through a mask from a solution of doped Polymer 1 as used in Example 7 to cover a roughly rectangular area 14×36 microns positioned to overlap electrode 25 and the regions of layers 24 and 26 over electrode 21, and dried in a vacuum oven,
5) a hermetic seal is placed over the entire device (not shown in FIG. 5).

Example 19

Organic Transistor

As in Example 18 except that the dimensions are all reduced linearly by a factor of 5, and microcontact printing is used to replace each step involving spray deposition through a mask.

Example 20

Doped Conjugated Dye p-n Junction

A toluene solution of zinc 5-(4-methylpyridinium)-10,15,20-triphenyl-porphyrin chloride (1 ml, 10$^{-5}$ M) is treated with a solution of sodium naphthalide in tetrahydrofuran (THF) (0.1 ml, 10$^{-4}$ M), and filtered through a 1 micron filler and a 0.3 micron filter, all under a dry oxygen free atmosphere. The resulting solution is added to a solution of zinc tetraphenylporphyrin in toluene (20 ml, 10$^{-4}$ M). The resulting solution is used to cast a 100 nm layer of doped zinc tetraphenylporphyrin onto a conductive ITO coated polyester film.

A solution of tetramethylammonium copper 5-(4-phenyl-sulfonato)-10,15,20-tri(4-n-hexylphenyl)-porphyrin (1 ml, 10$^{-5}$M) is treated with a solution of nitrosonium tetrafluoroborate in THF (0.1 ml, 10$^{-4}$ M), and filtered through a 1 micron filler and a 0.3 micron filter, all under a dry oxygen free atmosphere. The resulting solution is added to a solution of copper tetra(4-n-hexylphenyl)porphyrin in toluene (20 ml, $10^{-4}$ M). The resulting solution is used to cast a 100 nm layer of doped copper tetra(4-n-hexylphenyl)porphyrin over the previously cast layer of doped zinc tetraphenylporphyrin.

A 500 nm aluminum electrode is deposited on top of the copper porphyrin layer by vacuum evaporation.

Example 21

Self-Doped Polymer p-n Junction

Monomer for Anionic Repeat Unit

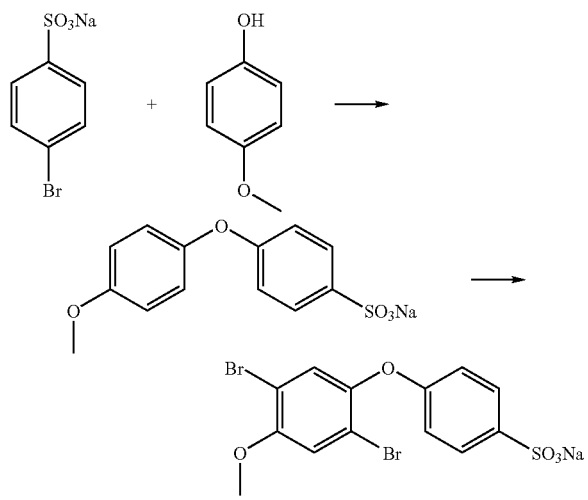

To a solution of sodium 4-bromobenzenesulfonate (35.22 g, 0.1 mol) and 4-methoxyphenol (12.41 g, 0.1 mol) in DMF (200 ml) is added sodium carbonate (11.66 g, 0.11 mol), copper iodide (0.002 mol) and 2,2'-bipyridine (0.002 mol). The mixture is held under nitrogen and stirred at 130° C. for 8 h. The mixture is cooled to RT and extracted with methylene chloride against brine. The crude product is recrystallized from ethanol-water.

To a solution of the above 4-methoxy-4'-(trimethylammonium)-phenylether chloride (13.35 g, 0.05 mol) in methylene chloride (100 ml) is added bromine (16 g, 0.1 mol) dropwise with stirring. After 24 h the excess bromine and solvent are removed under vacuum. The crude product is recrystallized from ethanol-water.

Example 22

Self-Doped Polymer, p-Type

Poly(1,4-(2,5-dihexyloxyphenylene)-4,4'-triphenylaminediyl-co-1,4-(2-methoxy-5-(4-sodium sulfonatophenyleneoxy))phenylene), Polymer 5

Working in an inert atmosphere dry-box the following reagents are combined in a 40 ml glass vial: 1,4-(bis-boronic acid ethyleneglycol ester)-2,5-dihexyloxybenzene (0.1631 g, 0.390 mmol), 4,4'-dibromotriphenylamine (0.1444 g, 0.358 mmol), sodium 1,4-dibromo-2-methoxy-5-(4-sulfonatophenyleneoxy)benzene (1.27 mg, 0.003 mmol), palladium tetrakistriphenylphosphine (0.7 ml of a solution of mg in 5 ml toluene), toluene (1.55 ml), and Aliquat 336 (tricaprylylmethylammonium chloride) (0.75 ml of a 60% solution (wt/wt) in toluene). The vial is sealed with a cap fitted with a rubber septum and removed from the dry-box. An aqueous solution 2 M in $K_2CO_3$ (1.5 ml) is added by syringe and the vial heated in an orbital shaker held at 95° C. for 24 h. The organic layer is coagulated twice into methanol. The solid Polymer 5 is collected by vacuum filtration.

Polymer 5 (0.062 g, 0.001 mmol based on dopant) is dissolved in 20 ml anhydrous THF. To this solution is added at room temperature in an inert atmosphere glove box nitrosonium tetrafluoroborate (0.000117 g, as a solution in THF 1 ml prepared by serial dilution). The mixture is filtered (or centrifuged) to remove the byproduct sodium tetrafluoroborate and any remaining starting material. The resulting solution of self-doped Polymer 5 is used as is in the next step.

Example 23

Self-Doped Polymer, n-Type

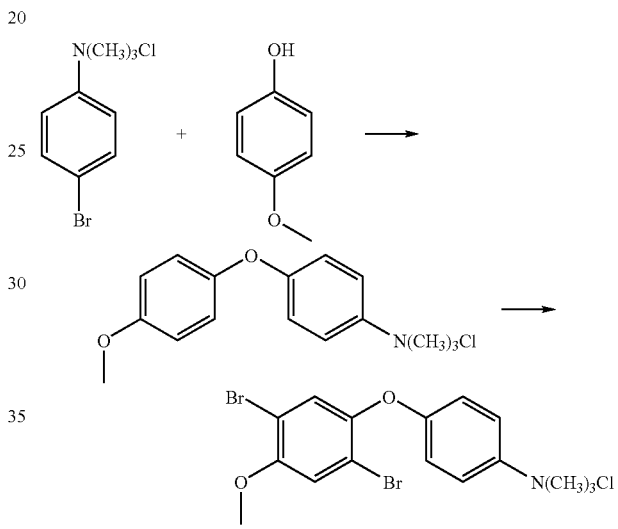

Example 24

Monomer for Cationic Repeat Unit

To a solution of sodium 4-trimethyammoniumbromobenzene chloride (25.06 g, 0.1 mol) and 4-methoxyphenol (12.41 g, 0.1 mol) in DMF (200 ml) is added sodium carbonate (11.66 g, 0.11 mol), copper iodide (0.002 mol) and 2,2'-bipyridine (0.002 mol). The mixture is held under nitrogen and stirred at 130° C. for 8 h. The mixture is cooled to RT and extracted with methylene chloride against brine. The crude product is recrystallized from ethanol-water.

To a solution of the above 4-methoxy-4'-(trimethylammonium)-phenylether chloride (14.67 g, 0.05 mol) in methylene chloride (100 ml) is added bromine (16 g, 0.1 mol) dropwise with stirring. After 24 h the excess bromine and solvent are removed under vacuum. The crude product is recrystallized from ethanol-water.

Poly(1,4-(2,5-dihexyloxyphenylene)-1,4-phenyloxadiazolylphenylene-co-1,4-(2-methoxy-5-(4-trimethylammoniumphenyleneoxy chloride)-phenylene)), Polymer 6

Working in an inert atmosphere dry-box the following reagents are combined in a 40 ml glass vial: 1,4-(bis-boronic acid ethyleneglycol ester)-2,5-dihexyloxybenzene (0.2374 g, 0.568 mmol), 2,5-dibromodiphenyloxadiazole (0.1976 g, 0.5174 mmol), 1,4-dibromo-2-methoxy-5-(4-trimethylammonium)benzene chloride (1.174 mg, 0.0026 mmol), palladium tetrakistriphenylphosphine (12 mg, added as 1 ml of a solution of 60 mg in 5 ml toluene), toluene (0.65 ml), and Aliquat 336 (tricaprylylmethylammonium chloride) (0.35 ml of a 60% solution (wt/wt) in toluene). The vial is sealed with a cap fitted with a rubber septum and removed from the dry-box. An aqueous solution 2 M in $K_2CO_3$ (0.8 ml) is added by syringe and the vial heated in an orbital shaker held at 95° C. for 38 h. The organic layer is coagulated twice into methanol, filtered and dried under vacuum to yield Polymer 6 as a powder.

Polymer 6 (0.001 mmol. based on dopant) is dissolved in 20 ml anhydrous THF. To this solution is added at room temperature in an inert atmosphere glove box sodium naphthalide (0.000151 g, as a solution in THF, 1 ml. prepared by serial. dilution). The mixture is filtered (or centrifuged) to remove the byproduct sodium chloride and any remaining starting material. The resulting solution of sell-doped Polymer 6 is used as is in the next step.

Example 25

Self-Doped p-n Junction

A solution of self-doped Polymer 5 is spin coated onto a substrate of ITO on polyester (e.g., OC-50 film from CPFilms Inc. Martinsville, Va.) and vacuum dried to give a 750 nm layer. A solution of self-doped Polymer 6 is spin coated onto a second substrate of gold on polyester and vacuum dried to give a 900 nm layer. The two film coated substrates are laminated with heat (temperature determined by trial and error as the minimum temperature at which the substrates adhere) and pressure such that the doped polymer films are in contact. Electrical contact is made to a small section of each substrate that extends beyond the laminated area that is left unlaminated and from which self-doped polymer is either removed or was not applied in the earlier step.

When illuminated from either side a photovoltage is developed between the ITO and gold electrodes.

Example 26

Polymeric Chromophore Diode 5,15-di(4-bromophenyl)-10,20-di(4-n-butylphenyl) porphyrin Following the general procedure for preparation of tetraphenylporphyrins (see for example *J. Heterocycl. Chem.*, 1975, 12, 343) 4-bromobenzaldehyde (0.35 mol) and 4-n-butylbenzaldehyde (0.35 mol) are dissolved in refluxing glacial acetic acid. Pyrrole (freshly distilled) (48.6 ml, 0.7 mol) is then slowly added to the boiling solution, caution being taken to avoid excessive heating as the reaction is exothermic. The resulting dark solution is heated to reflux for 20 min, then chloroform (250 ml) is added, while the solution is allowed to cool, preventing the separation of tarry by-products. The resulting mixture is cooled in an ice bath to 35° C. and the purple crystals isolated by filtration and washed with chloroform until the washings are colorless.

The desired product is separated from other mixed porphyrins (e.g., 5-(4-bromophenyl)-10,15,20-(tri(4-n-butylphenyl porphyrin, and tetra-5,10,15,20-(4-bromophenyl)porphyrin) and the cis isomer by column chromatography using chloroform on thin layer chromatography grade silica gel.

Alternatively, the method in *Org. Syn.* 76, 287, is modified by substituting 4-n-butylbenzaldehyde for benzaldehyde in the preparation of 5-(phenyl)dipyrromethane forming instead 5-(4-n-butylphenyl)dipyrromethane. Substituting 5-(4-n-butylphenyl)dipyrromethane for 5-phenyldipyrromethane, and 4-bromobenzaldehyde for trimethylorthoformate in the porphyrin condensation step.

The free base porphyrin is converted to the zinc complex by treatment with a 50 mol % excess of zinc acetate in acetic acid. The zinc porphyrin is recovered by slow addition of methanol. The crystalline solid is filtered, washed with methanol, and dried.

Working in an inert atmosphere dry-box the following reagents are combined in a 40 ml glass vial: 1,4-(bis-boronic acid ethyleneglycol ester)-2,5-dihexyloxybenzene (0.2374 g, 0.568 mmol), zinc 5,15-di(4-bromophenyl)-10,20-di(4-n-butylphenyl)porphyrin (0.517 g, 0.550 mmol), palladium tetrakistriphenylphosphine (12 mg), potassium carbonate (0.23 g), and anhydrous DMF (3 ml). The vial is sealed with a cap fitted with a rubber septum and removed from the dry-box and heated in an orbital shaker held at 95° C. for 38 h. The organic layer is coagulated twice into methanol, filtered and dried under vacuum to yield a dark powder.

The porphyrin polymer (0.1 g) is dissolved in a mixture of toluene and methylene chloride along with Donor Zwitterion from Example 2 above such that there is 0.001 equivalents of Donor Zwitterion for each porphyrin repeat unit, filtered, and spin coated onto an ITO coated glass substrate to give 150 nm layer, and dried under vacuum. Under inert atmosphere a solution of Polymer 1 in THF-toluene is mixed with a solution of Acceptor Zwitterion from Example 1 above such that there is 0.005 equivalents of Acceptor Zwitterion for each 1 equivalent of triarylamine repeat unit in the polymer in solution and the concentration is suitable for spin coating (approximately 0.1 to 1 g/L). This mixture is used to spin coat a 150 film of doped Polymer 1 on top of the previously deposited porphyrin polymer, and dried in vacuum.

An aluminum electrode is vacuum evaporated on top of the layer of doped Polymer 1 through a shadow mask.

When illuminated through the ITO/glass substrate a photovoltage develops across the ITO and Al electrodes.

Example 27 n-Type $TiO_2$-Chromophore-p-Type Organic Semiconductor PV Cell

A smooth $TiO_2$ coating was prepared on commercial conductive glass sheet using the following procedure.
Titanium Bis(Acetylacetone)

To a dried vial fitted with a stir bar and septum cap was added titanium tetraisopropoxide (2.8573 g, 1.005 mmol) then 2,4-pentanedione (1.0257 g, 1.0245 mmol), and quickly cooled in an ice water bath. The dark yellow liquid was stirred overnight at room temperature. The solution was then diluted with 32.4 ml ethanol (200 proof).
Spray Pyrolysis The titanium bis(acetylacetone) solution was placed into a glass chromatography spray apparatus (Aldrich). The apparatus was pressurized slightly with nitrogen, and the solution was sprayed in a single pass onto a tin oxide coated glass sheet (TEC 15 glass, Pilkington, Toledo, Ohio) heated in air on a hot plate to 450° C., annealed in air on the hot plate at 450° C.

to 500° C. for 1 h, then allowed to cool. Two point resistance measurement gave 37 ohms with the probes approximately 1 cm apart.

Cell Fabrication

The oligomeric tris(4,4'-dialkyl-2,2' bipyridyl)ruthenium hexafluorophosphate polymer (M. Hara, J. t. Lean, and T. E. Mallouk, *Chem. Mater.*, 2001, 13, 4668-4675) is spin coated from acetonitrile onto the previously prepared $TiO_2$ surface to give a 40 nm layer. Under inert atmosphere a solution of Polymer 1 is mixed with a solution of Acceptor Zwitterion from Example 1 above such that there is 0.0015 equivalents of Acceptor Zwitterion for each 1 equivalent of triarylamine repeat unit in solution and the concentration is suitable for spin coating (approximately 0.1 to 1 g/L). This mixture is used to spin coat an 800 nm film of doped Polymer 1 onto the ruthenium polymer film. The coated substrate is heated to 100° C. in a vacuum for 15 min, held under vacuum at RT for 24 h, and returned to the inert atmosphere environment. A 500 nm layer of gold is then sputtered onto the doped Polymer 1 layer.

When illuminated through the glass substrate a photovoltage develops across the TEC 15 conducting glass and gold electrodes.

Example 28

Polymeric Chromophore Diode

Under inert atmosphere a solution of Polymer 1 in THF-toluene is mixed with a solution of Acceptor Zwitterion from Example 1 above such that there is 0.005 equivalents of Acceptor Zwitterion for each 1 equivalent of triarylamine repeat unit in the polymer in solution and the concentration is suitable for spin coating (approximately 0.1 to 1 g/L). This mixture is used to spin coat a 150 film of doped Polymer 1 onto an ITO coated glass substrate, and dried under vacuum.

The porphyrin polymer of Example 27 (0.1 g) is dissolved in a mixture of toluene and methylene chloride along with Donor Zwitterion from Example 2 above such that there is 0.001 equivalents of Donor Zwitterion for each porphyrin repeat unit, filtered, and spin coated on top of the previously deposited Polymer 1 layer, and dried in vacuum.

An aluminum electrode is vacuum evaporated on top of the layer of porphyrin polymer through a shadow mask.

When illuminated through the ITO/glass substrate a photovoltage develops across the ITO and Al electrodes.

Although specific embodiments and examples are disclosed herein, it is expected that persons skilled in the art can and will design diodes and other electrical devices utilizing the organic materials described herein that are within the scope of the following description either literally or under the Doctrine of Equivalents.

What is claimed is:

1. A method for forming a diode comprising the steps of:
   preparing a first region comprising an organic material doped with an immobile dopant, wherein the organic material is selected from the group consisting of a conjugated molecule, an oligomer, and a polymer, and
   preparing a second region in contact with the first region, comprising a semiconductor selected from the group consisting of a doped inorganic semiconductor and an organic material doped with an immobile dopant, wherein the organic material. is selected from the group consisting of a conjugated molecule, an oligomer, and a polymer.

2. The method according to claim 1, wherein the first region is prepared by the steps of:
   forming a solution of a first doped polymer, and forming a layer of a first doped polymer; and where the second region is an organic material doped with an immobile dopant said region is prepared by the steps of:
   forming a solution of a second doped polymer, and forming a layer of a second doped polymer.

3. The method of claim 2, where the step of forming the region comprising organic material. doped with an immobile dopant involves a process selected from the group consisting of spin coating, dip coating, spray coating, curtain coating, doctor blading, screen printing, roll printing, flexographic printing, offset printing, ink jet printing, spray painting, stamping and brush painting.

4. The method of claim 2, where the first and second regions are brought into contact by laminating the first layer with the second region.

5. The method of claim 2, where the first and second doped polymers each comprise the same polymer thereby forming a homojunction.

6. The method of claim 2, where the first and second doped polymers each comprise a different conjugated polymer thereby forming a heterojunction.

7. The method of claim 2, where the first doped polymer film is formed over an electrode.

8. The method of claim 7, where the electrode is a transparent electrode.

9. The method of claim 2, including the step of forming a layer of the second doped polymer over or partially over the first doped polymer layer.

10. A method for forming a diode comprising the steps of:
    preparing a first region comprising an organic material. doped with an immobile dopant, wherein the organic material is selected from the group consisting of a conjugated molecule, an oligomer, and a polymer,
    preparing a second region in contact with the first region, comprising a semiconductor selected from the group consisting of a doped inorganic semiconductor and an organic material doped with an immobile dopant, wherein the organic material is selected from the group consisting of a conjugated molecule, an oligomer, and a polymer, and
    wherein the first region is prepared by the steps of:
    dissolving a first undoped polymer in a solvent,
    reacting the first undoped polymer with a doping agent to produce a doped polymer and byproducts such that the doped polymer remains in solution and the byproducts precipitate,
    filtering the solution to remove the byproducts, and
    forming a layer of the first doped polymer from the filtered solution of the first doped polymer; and
    where the second region is an organic material doped with an immobile dopant said region is prepared by the steps of:
    dissolving a second undoped polymer in a solvent,
    reacting the second undoped polymer with a second doping agent to produce a second doped polymer and byproducts such that the second doped polymer remains in solution and the byproducts precipitate,
    filtering the solution to remove the byproducts, and
    forming a layer of the second doped polymer from the filtered solution of the second doped polymer.

11. The method of claim 10, where one or both of the first and second undoped polymers are ionic and the corresponding doped polymer is a self-doped polymer.

12. The method of claim 10, where the step of forming the layer involves a process selected from the group consisting of spin coating, dip coating, spray coating, curtain coating, doctor blading, screen printing, roll printing, flexographic printing, offset printing, ink jet printing, spray painting, stamping and brush painting.

13. The method of claim 10, where the first and second regions are brought into contact by laminating the first layer with the second region.

14. The method of claim 10, where the first and second doped polymers each comprise the same polymer thereby forming a homojunction.

15. The method of claim 10, where the first and second doped polymers each comprise a different conjugated polymer thereby forming a heterojunction.

16. The method of claim 10, where the first doped polymer film is formed over an electrode.

17. The method of claim 16, where the electrode is a transparent electrode.

18. The method of claim 10, including the step of forming a layer of the second doped polymer over or partially over the first doped polymer layer.

19. A method for forming a diode comprising the steps of:
preparing a first region comprising an organic material. doped with an immobile dopant, wherein the organic material is selected from the group consisting of a conjugated molecule, an oligomer, and a polymer,
preparing a second region in contact with the first region, comprising a semiconductor selected from the group consisting of a doped inorganic semiconductor and an organic material doped with an immobile dopant, wherein the organic material is selected from the group consisting of a conjugated molecule, an oligomer, and a polymer, and
wherein the first region is prepared by the steps of:
dissolving the first undoped polymer in a solvent,
treating the first undoped polymer with a doping agent to form a doped polymer, such that the doped polymer precipitates from solution and any byproducts of the reaction remain in solution,
filtering the solution to isolate the first doped polymer,
redissolving the first doped polymer in a second solvent to form a first doped polymer solution, and
forming a first layer of the first doped polymer solution; and
where the second region is an organic material doped with an immobile dopant said region is prepared by the steps of:
dissolving the second undoped polymer in a solvent,
treating the second undoped polymer with a doping agent to form a second doped polymer, such that the second doped polymer precipitates from solution and any byproducts of the reaction remain in solution,
filtering the solution to isolate the second doped polymer,
redissolving the second doped polymer in a second solvent, and
forming a second layer of the second doped polymer from the second doped polymer solution.

20. The method of claim 19, where one or both of the first and second undoped polymers are ionic and the corresponding doped polymer is a self-doped polymer.

21. The method of claim 19, where the step of forming the layer involves a process selected from the group consisting of spin coating, dip coating, spray coating, curtain coating, doctor blading, screen printing, roll printing, flexographic printing, offset printing, ink jet printing, spray painting, stamping and brush painting.

22. The method of claim 19, where the first and second regions are brought into contact by laminating the first layer with the second region.

23. The method of claim 19, where the first and second doped polymers each comprise the same polymer thereby forming a homojunction.

24. The method of claim 19, where the first and second doped polymers each comprise a different conjugated polymer thereby forming a heterojunction.

25. The method of claim 19, where the first doped polymer film is formed over an electrode.

26. The method of claim 25, where the electrode is a transparent electrode.

27. The method of claim 19, including the step of forming a layer of the second doped polymer over or partially over the first doped polymer layer.

* * * * *

UNITED STATES PATENT AND TRADEMARK OFFICE
CERTIFICATE OF CORRECTION

PATENT NO. : 8,124,443 B2  
APPLICATION NO. : 12/687986  
DATED : February 28, 2012  
INVENTOR(S) : Matthew L. Marrocco Page 1 of 1

It is certified that error appears in the above-identified patent and that said Letters Patent is hereby corrected as shown below:

Claim 1, line 65, delete "." after the word "material".
Claim 3, line 10, delete "." after the word "material".
Claim 10, line 34, delete "." after the word "material".
Claim 19, line 24, delete "." after the word "material".

Signed and Sealed this
Nineteenth Day of March, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,124,443 B2  
APPLICATION NO. : 12/687986  
DATED : February 28, 2012  
INVENTOR(S) : Matthew L. Marrocco Page 1 of 1

It is certified that error appears in the above-identified patent and that said Letters Patent is hereby corrected as shown below:

Claim 1, Column 33, line 65, delete "." after the word "material".  
Claim 3, Column 34, line 10, delete "." after the word "material".  
Claim 10, Column 34, line 34, delete "." after the word "material".  
Claim 19, Column 35, line 24, delete "." after the word "material".

This certificate supersedes the Certificate of Correction issued March 19, 2013.

Signed and Sealed this  
Ninth Day of April, 2013

Teresa Stanek Rea  
*Acting Director of the United States Patent and Trademark Office*